(12) United States Patent
Shau

(10) Patent No.: US 7,064,971 B2
(45) Date of Patent: Jun. 20, 2006

(54) METHODS FOR SAVING POWER AND AREA FOR CONTENT ADDRESSABLE MEMORY DEVICES

(76) Inventor: Jeng-Jye Shau, 3375 Scott Blvd., Suite 332, Santa Clara, CA (US) 95054

(*) Notice: Subject to any disclaimer, the term of this patent is extended or adjusted under 35 U.S.C. 154(b) by 96 days.

(21) Appl. No.: 10/752,317

(22) Filed: Jan. 5, 2004

(65) Prior Publication Data

US 2004/0141348 A1    Jul. 22, 2004

Related U.S. Application Data

(63) Continuation-in-part of application No. 10/057,425, filed on Jan. 25, 2002, now Pat. No. 6,674,660.

(51) Int. Cl.
*G11C 15/00*    (2006.01)
(52) U.S. Cl. .................................. 365/49; 365/195
(58) Field of Classification Search ................ 365/49, 365/195
See application file for complete search history.

(56) References Cited

U.S. PATENT DOCUMENTS

| 4,996,666 A | * | 2/1991 | Duluk, Jr. ..................... 365/49 |
| 5,257,220 A | * | 10/1993 | Shin et al. ..................... 365/49 |
| 6,317,351 B1 | * | 11/2001 | Choi et al. ..................... 365/49 |
| 6,888,730 B1 | * | 5/2005 | Foss et al. ..................... 365/49 |

* cited by examiner

*Primary Examiner*—Michael T. Tran

(57) ABSTRACT

Using 6 transistor memory cell to replace prior art 10 transistor binary content addressable memory (CAM) cells, and using 10 transistor ternary CAM (TCAM) cell to replace prior art 16 transistor TCAM cells, the present invention provided significant cost saving for high density CAM products. The power consumption problems of prior art high density CAM devices are solved by novel zoned lookup mechanism. For a high density CAM storing sorted data, lookup mechanisms of the present invention can reduce power consumption by two orders of magnitudes.

6 Claims, 30 Drawing Sheets

12T TCAM cell

10T TCAM cell

12T TCAM cell

12T TCAM cell

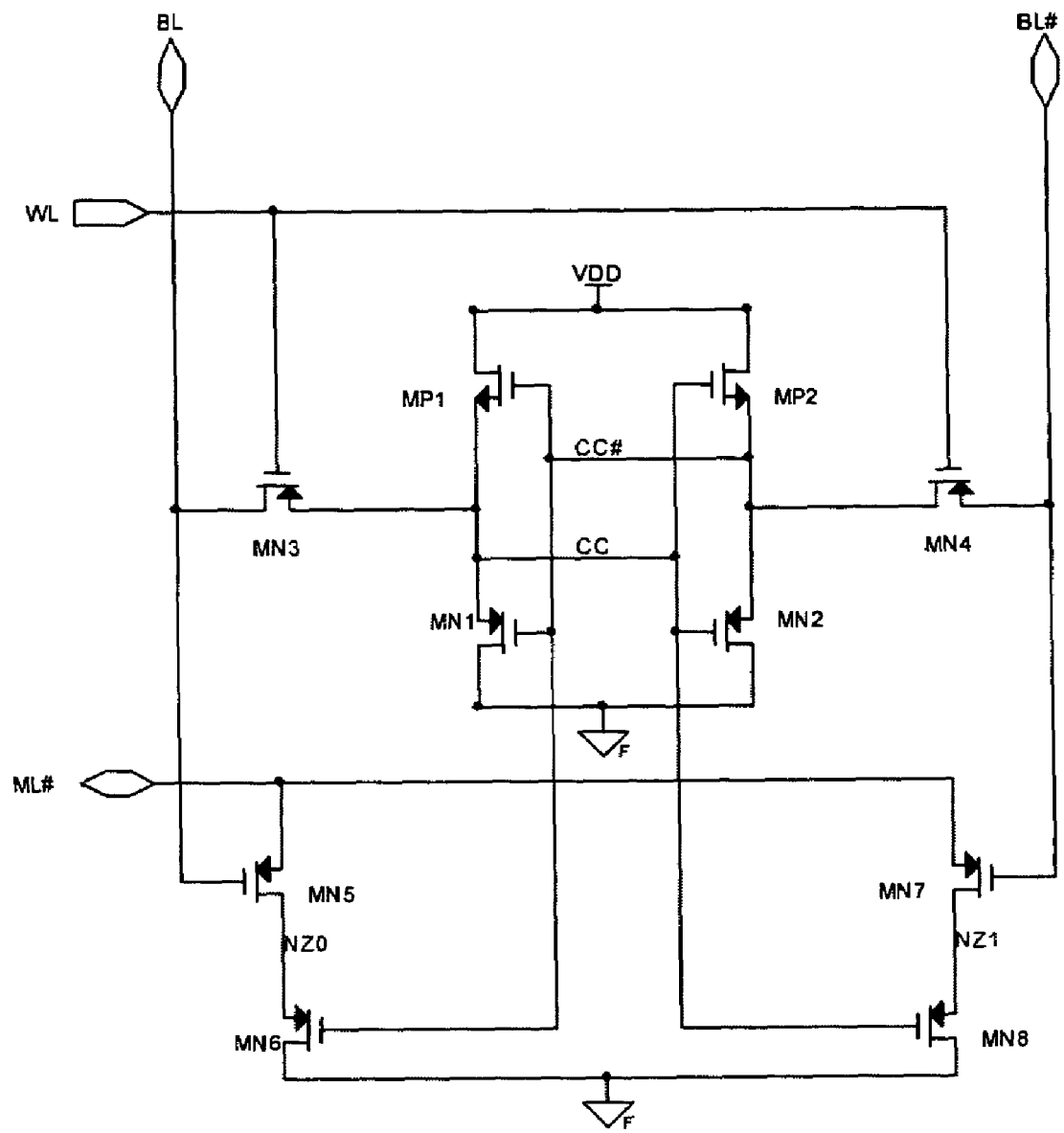
FIG. 1(a) Prior art 10T BCAM cell

FIG. 1(b) Prior art CAM entry
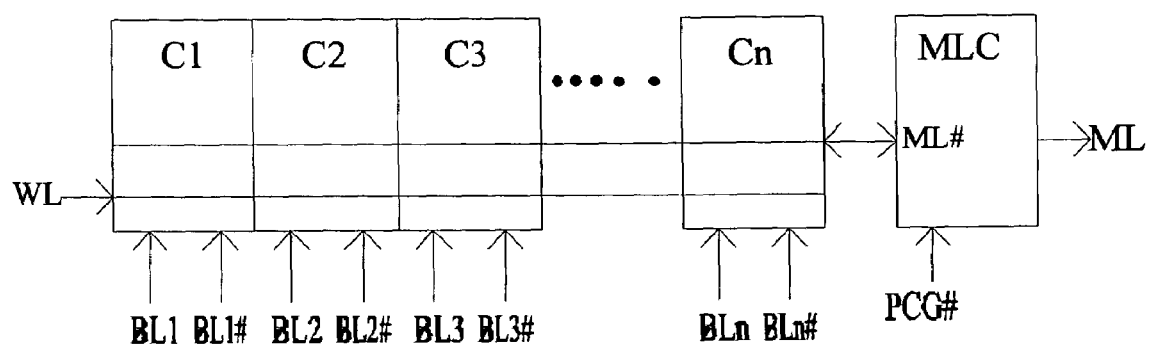

FIG. 1(c) Prior art miss line logic circuit
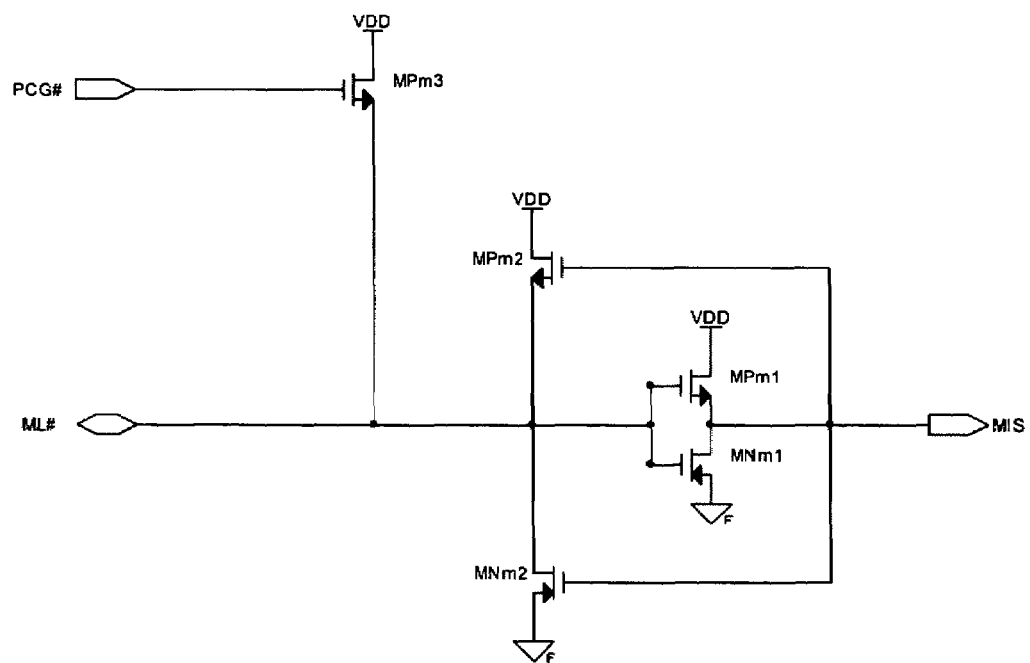

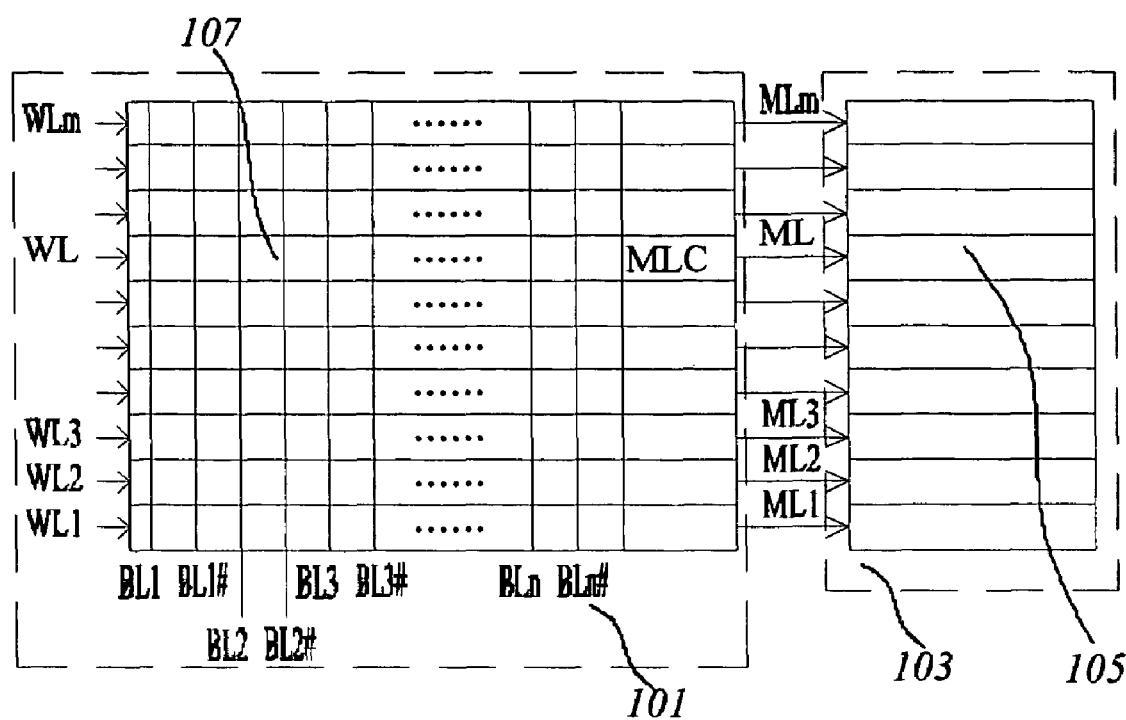
FIG. 1(d) Prior art CAM device overview

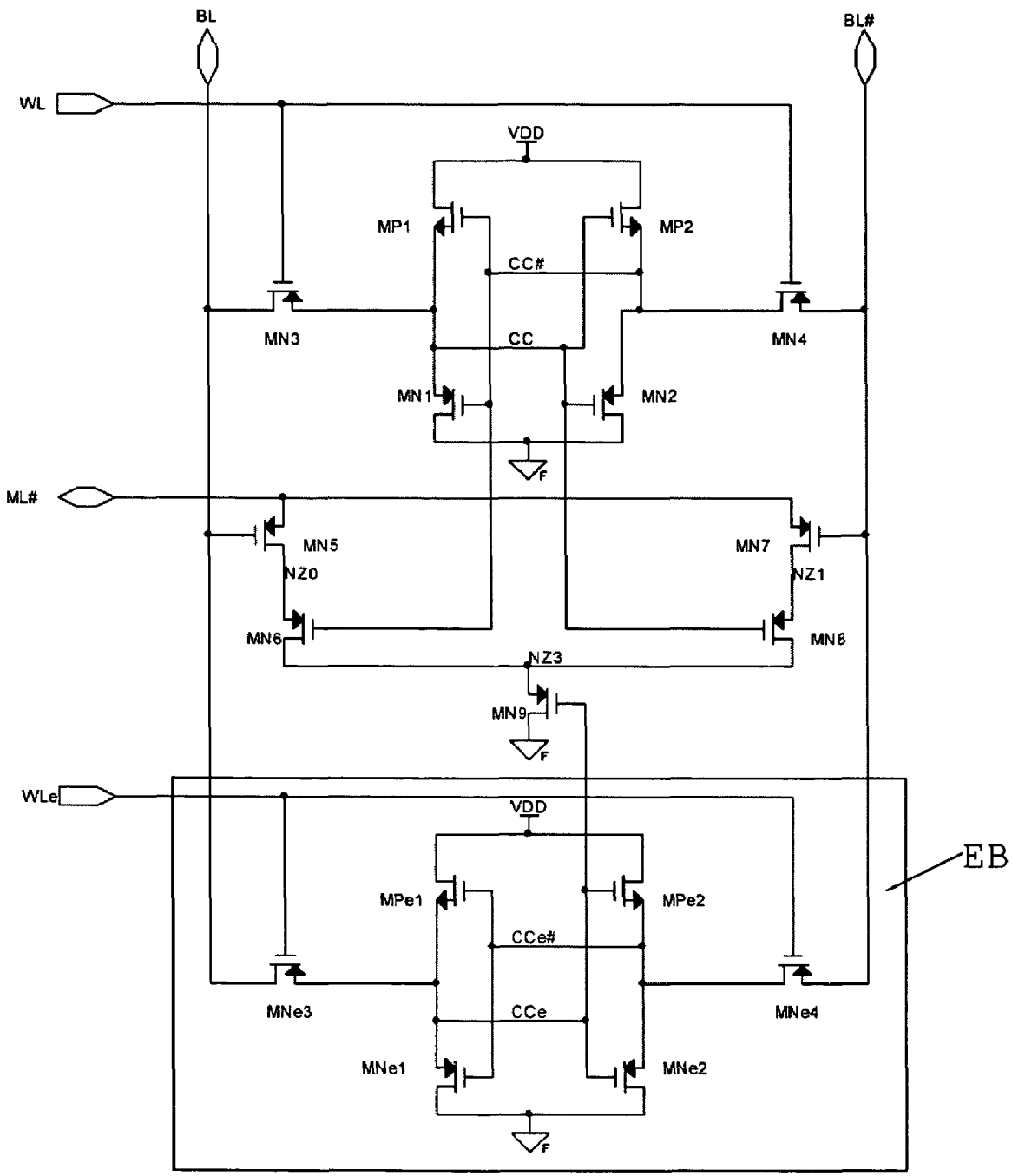
FIG. 2(a) Prior art TCAM cell

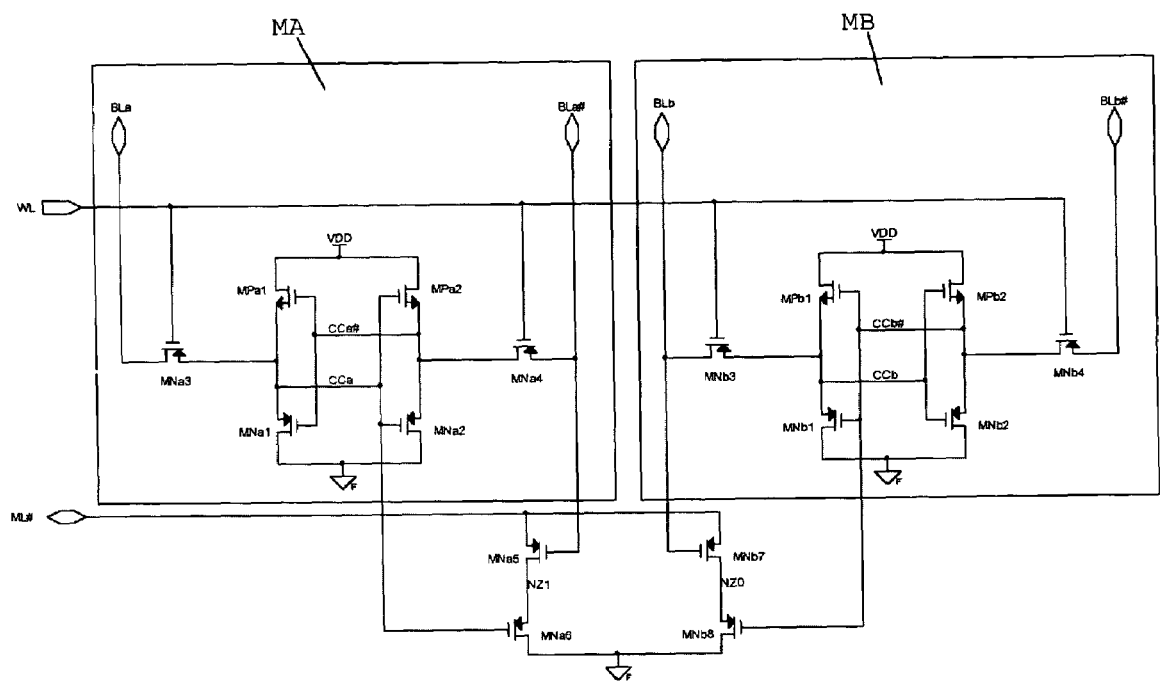
FIG. 2(b) Prior art TCAM cell

FIG. 3(a) 6T BCAM cell
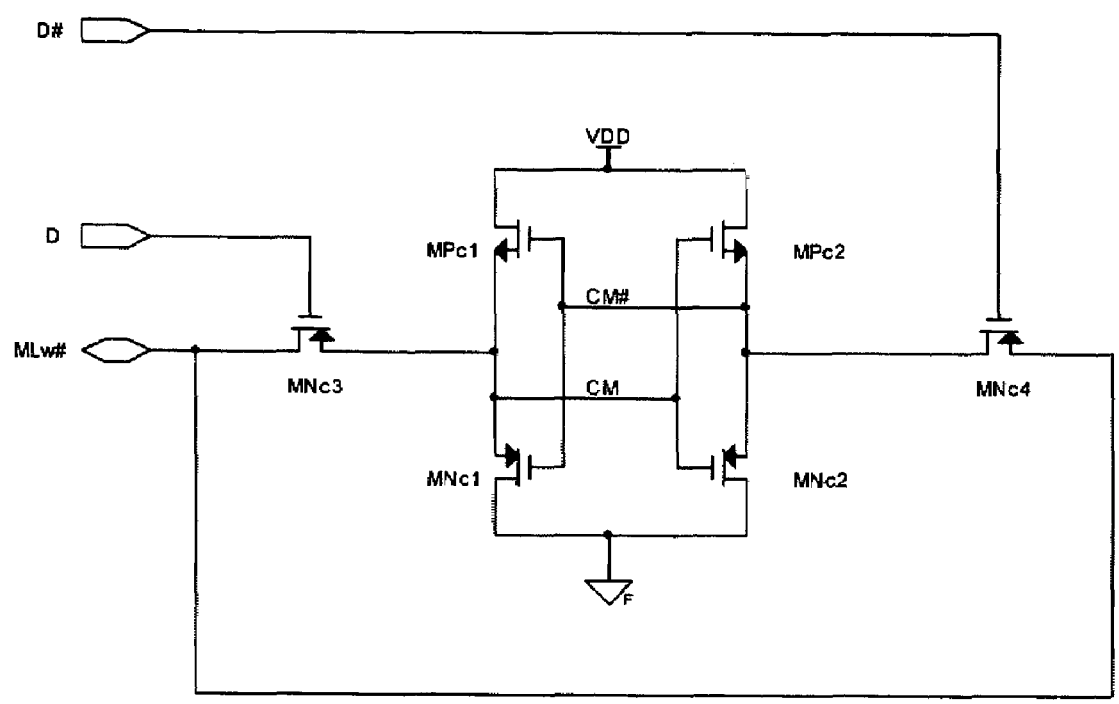

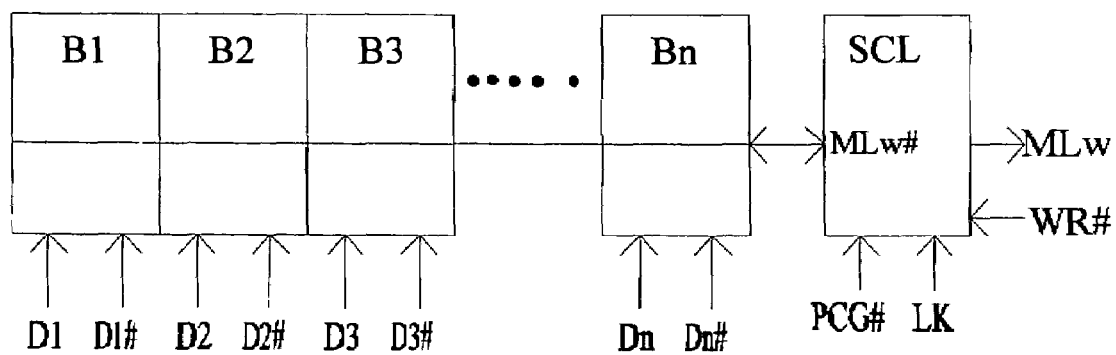
FIG. 3(b) CAM entry

FIG. 3(c) SC line logic circuit
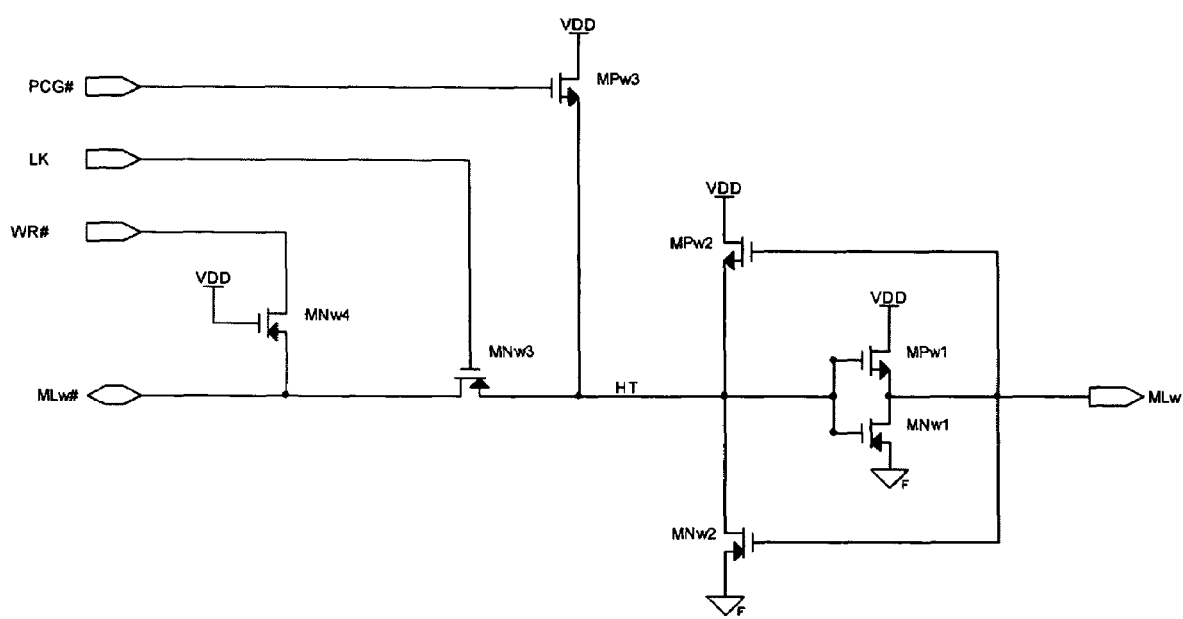

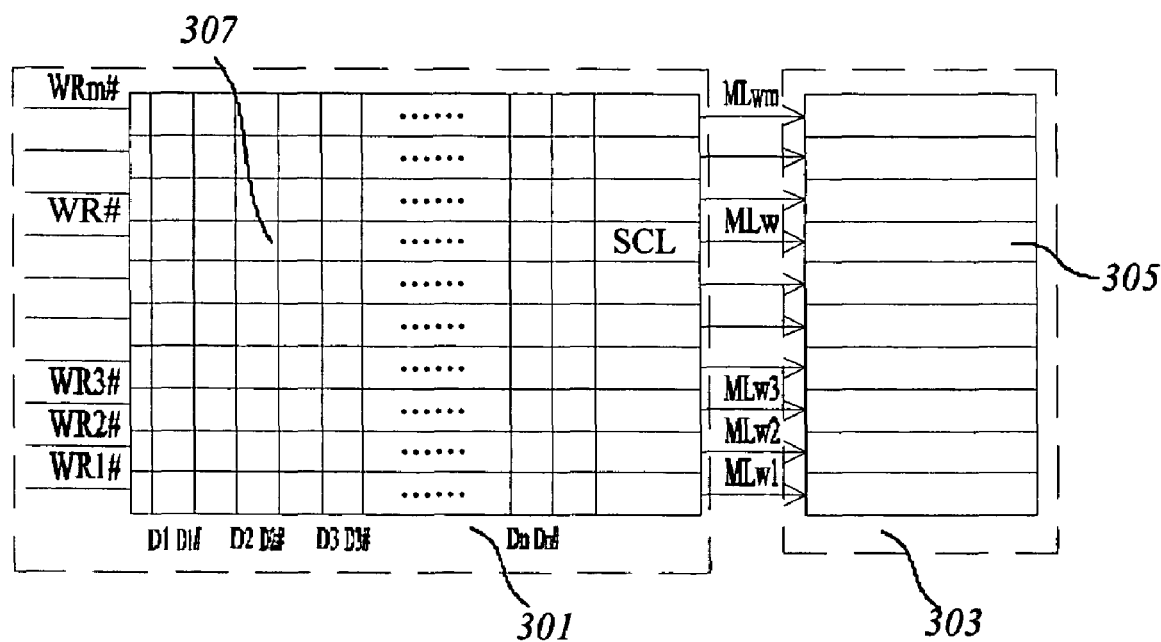
FIG. 3(d) CAM device overview

FIG. 3(e) Prior art RAM cell
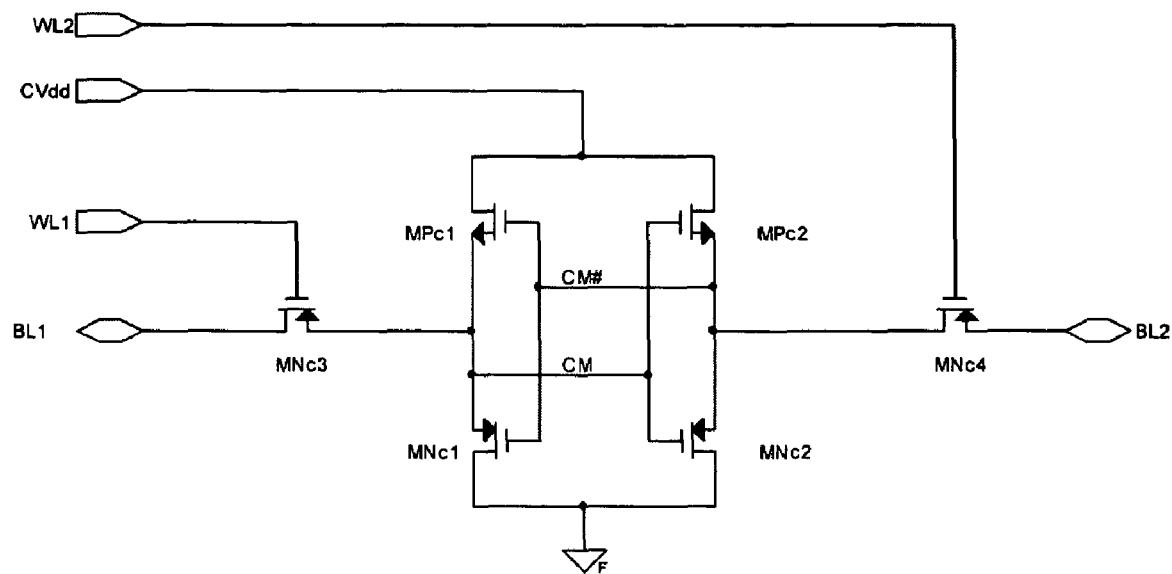

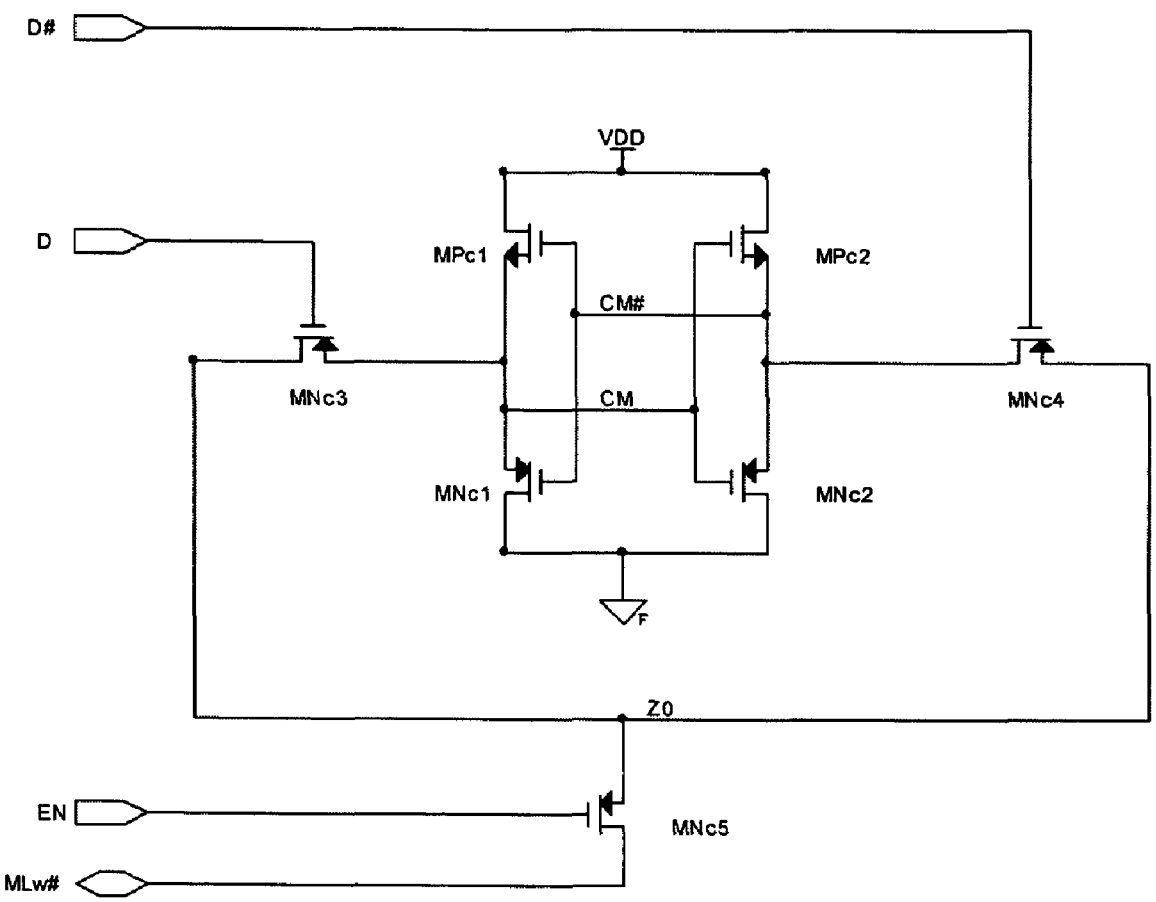
FIG. 3(f) 7T BCAM cell

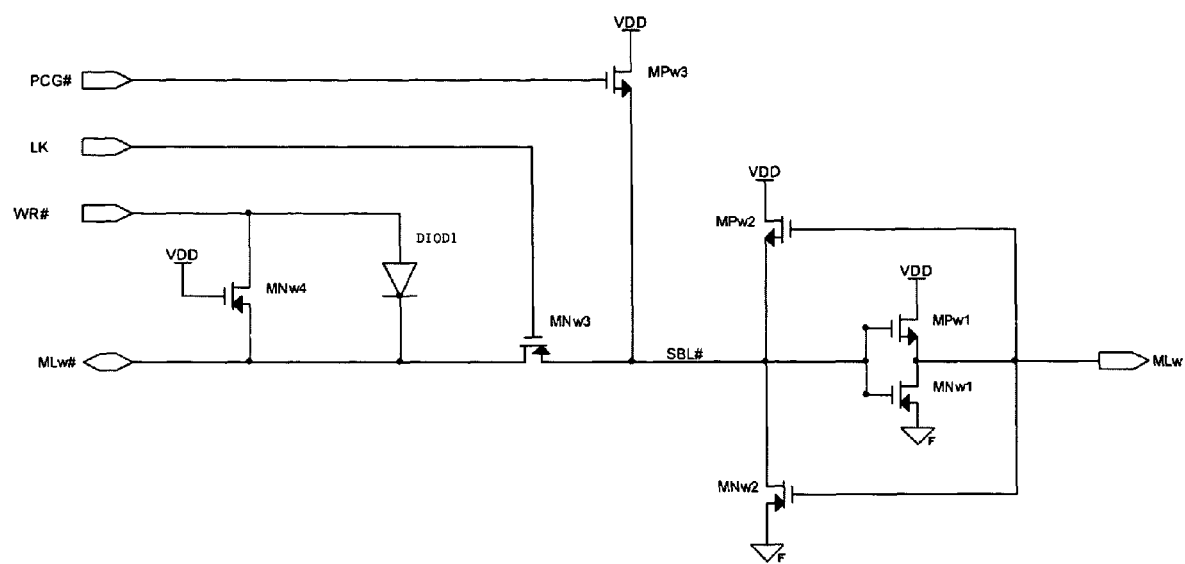
FIG. 3(g) SC line logic circuit

FIG. 3(h) 9T BCAM cell of the present invention
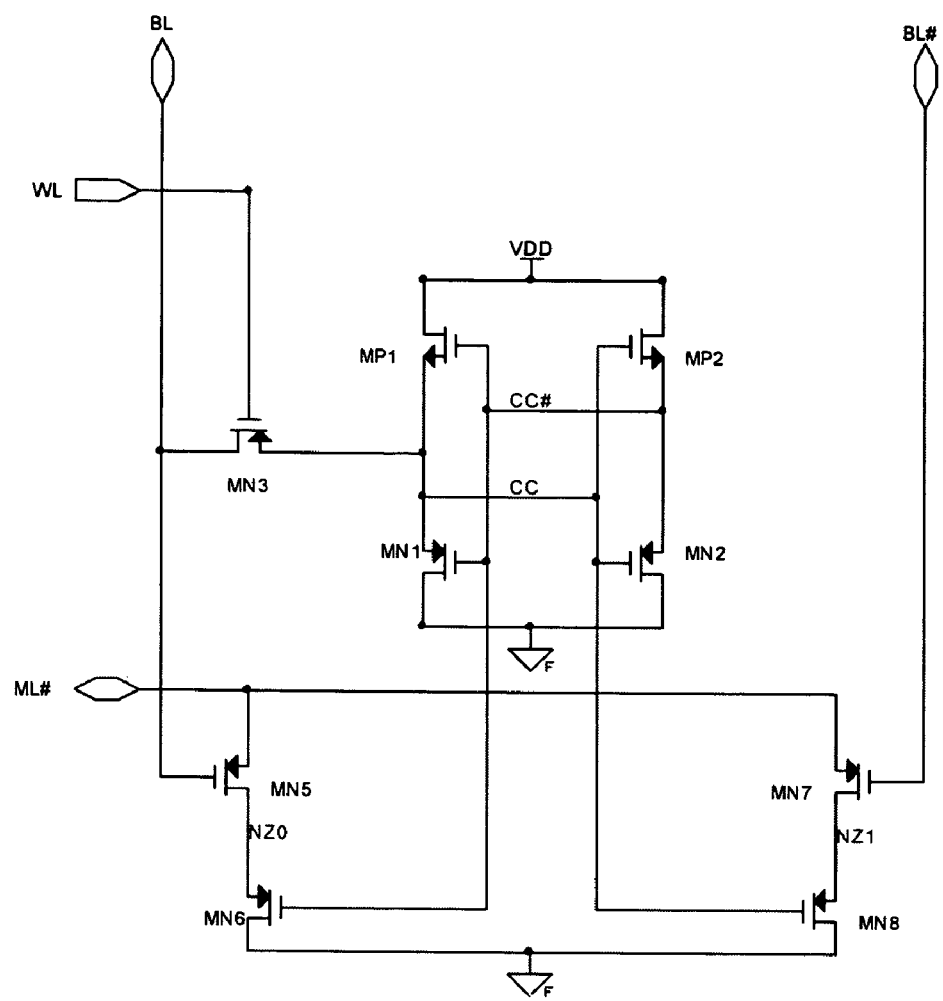

FIG. 3(i) 8T BCAM cell of the present invention
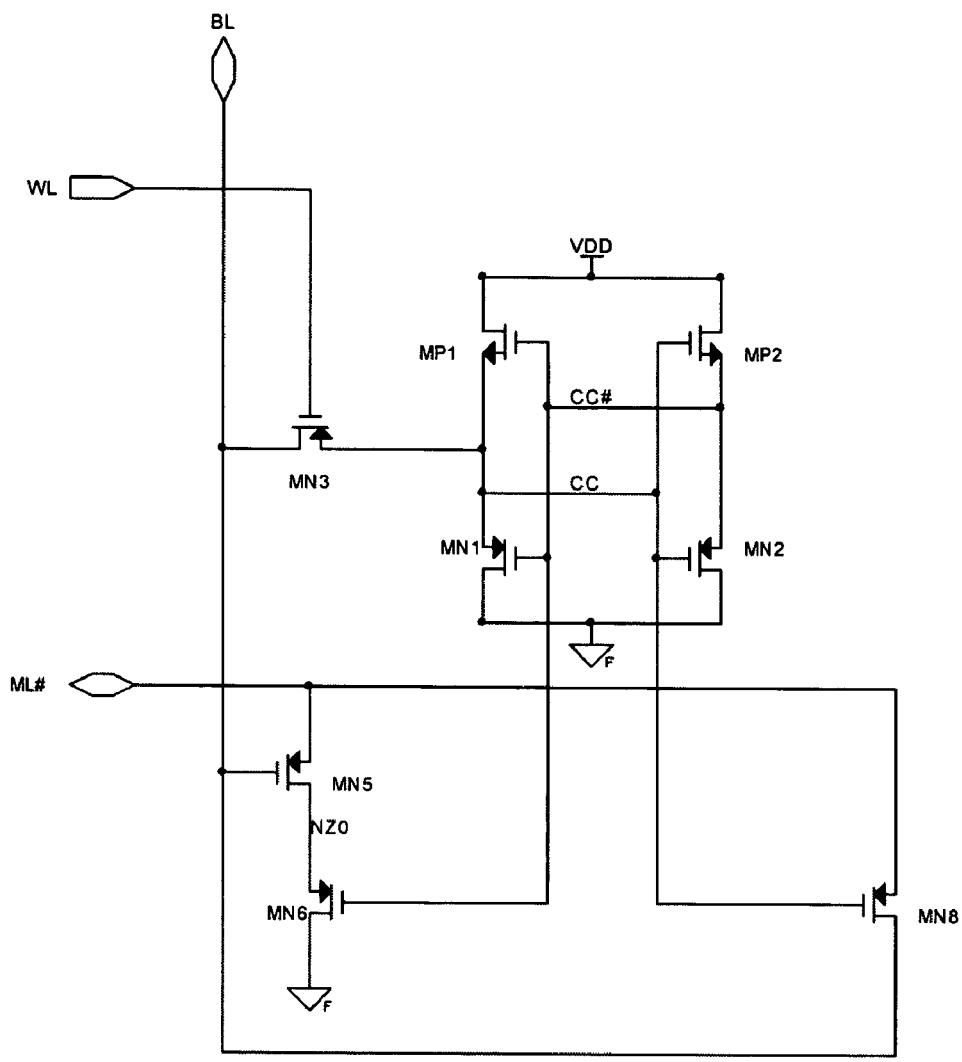

FIG. 3(j) 8T BCAM cell with independent lookup
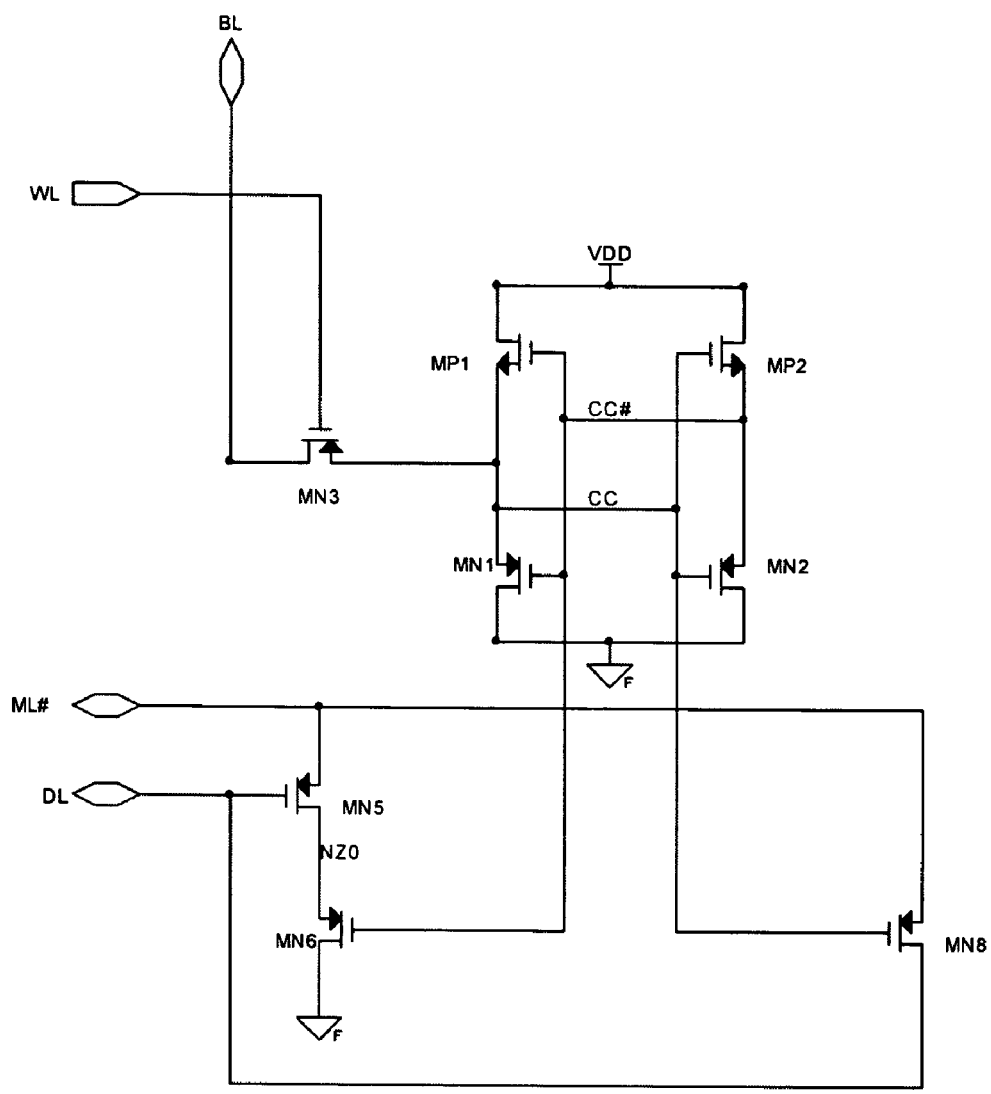

FIG. 4(a) 12T TCAM cell
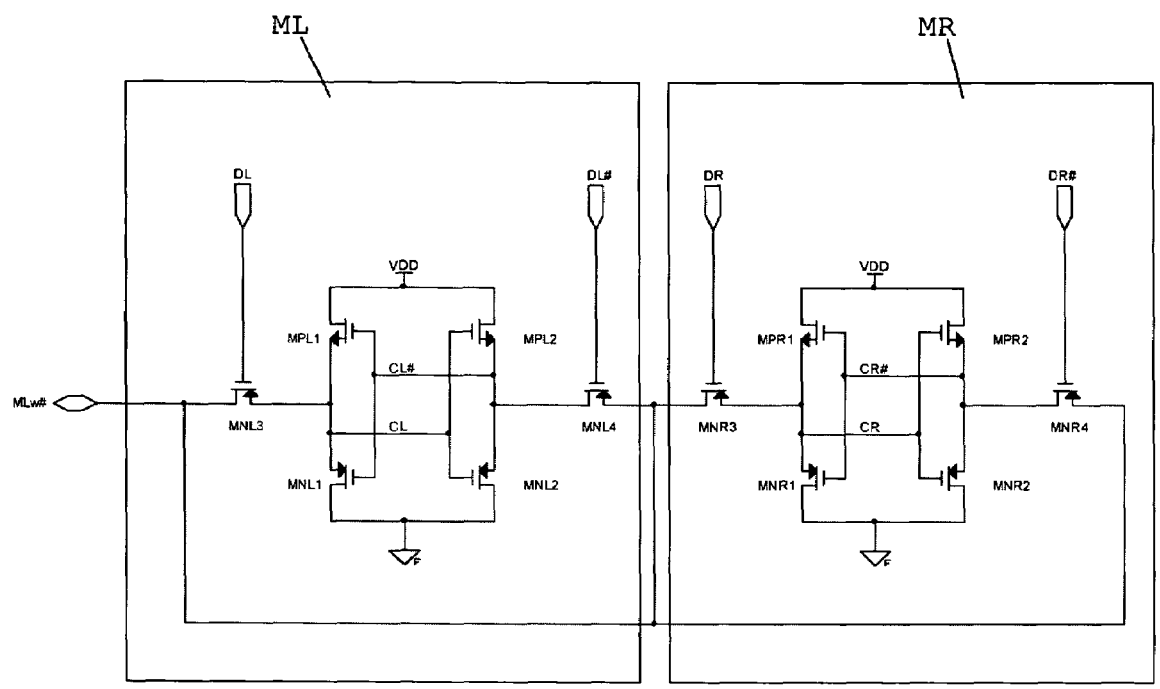

FIG. 4(b) 12T TCAM cell
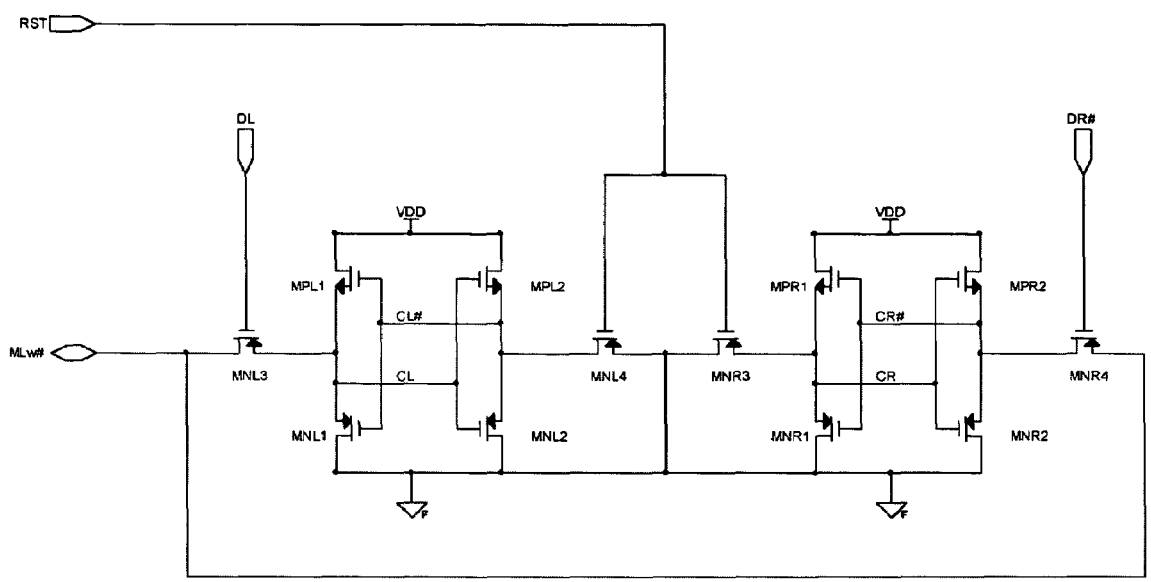

FIG. 4(c) 10T TCAM cell
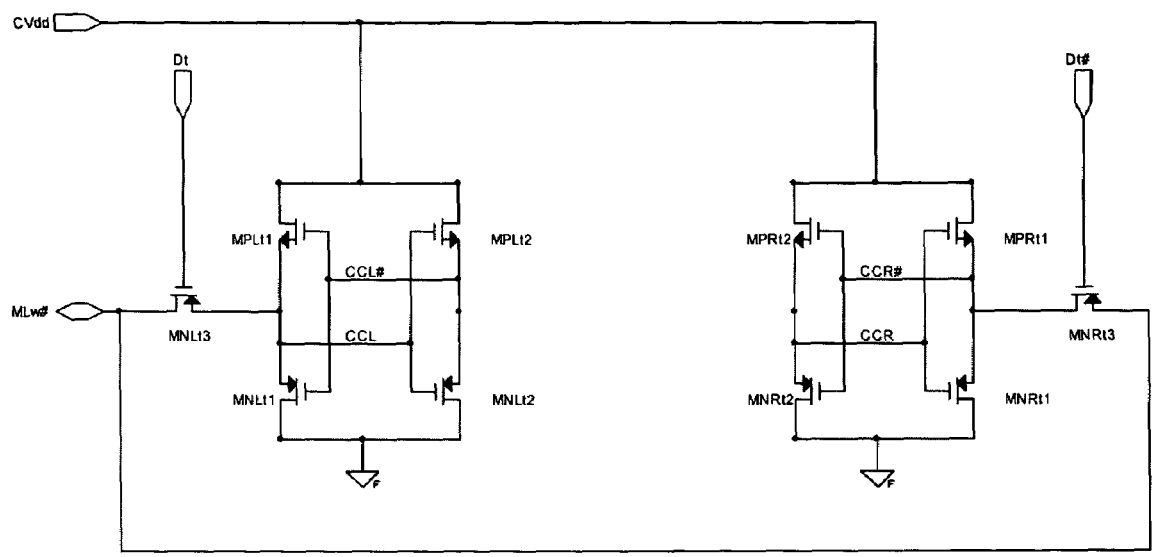

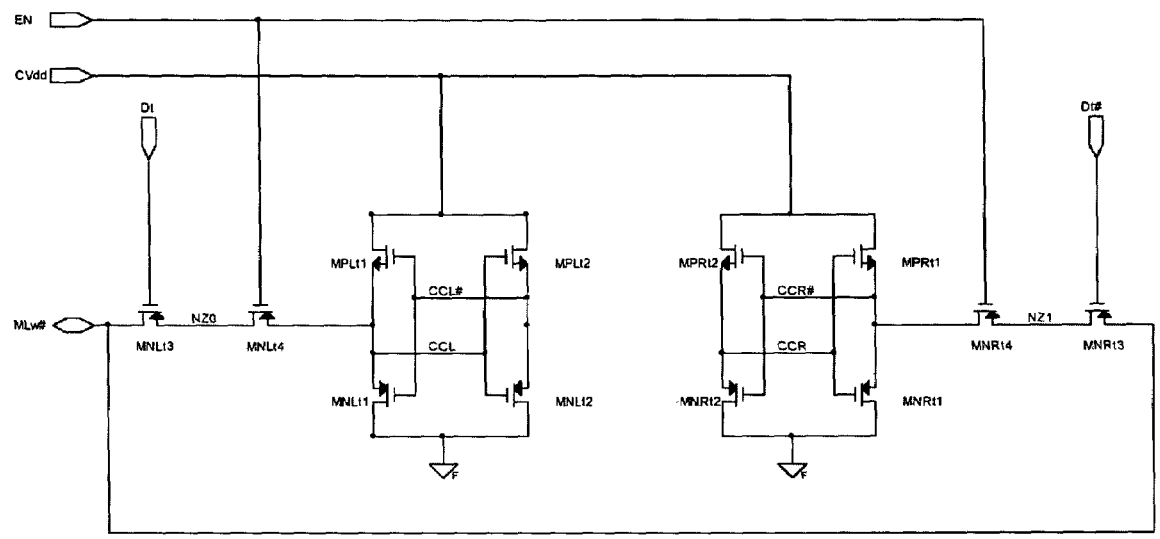
FIG. 4(d) 12T TCAM cell

FIG. 4(e) 14 transistor TCAM cell of the present invention
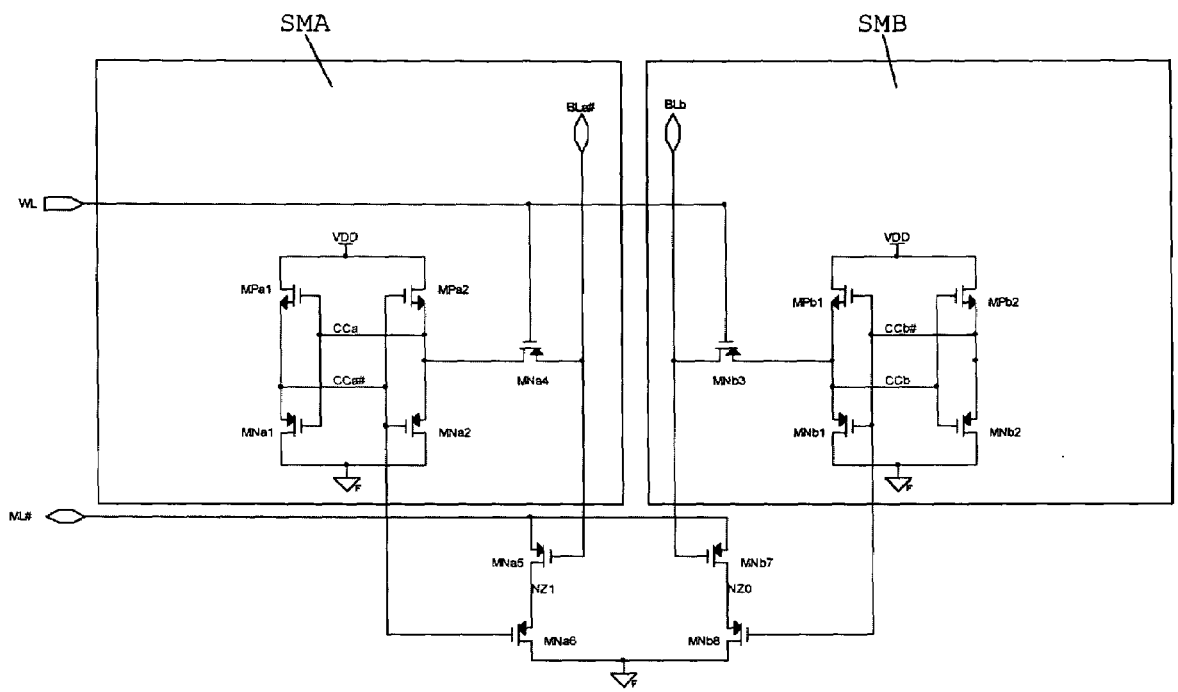

FIG. 4(f) 12 transistor TCAM cell of the present invention
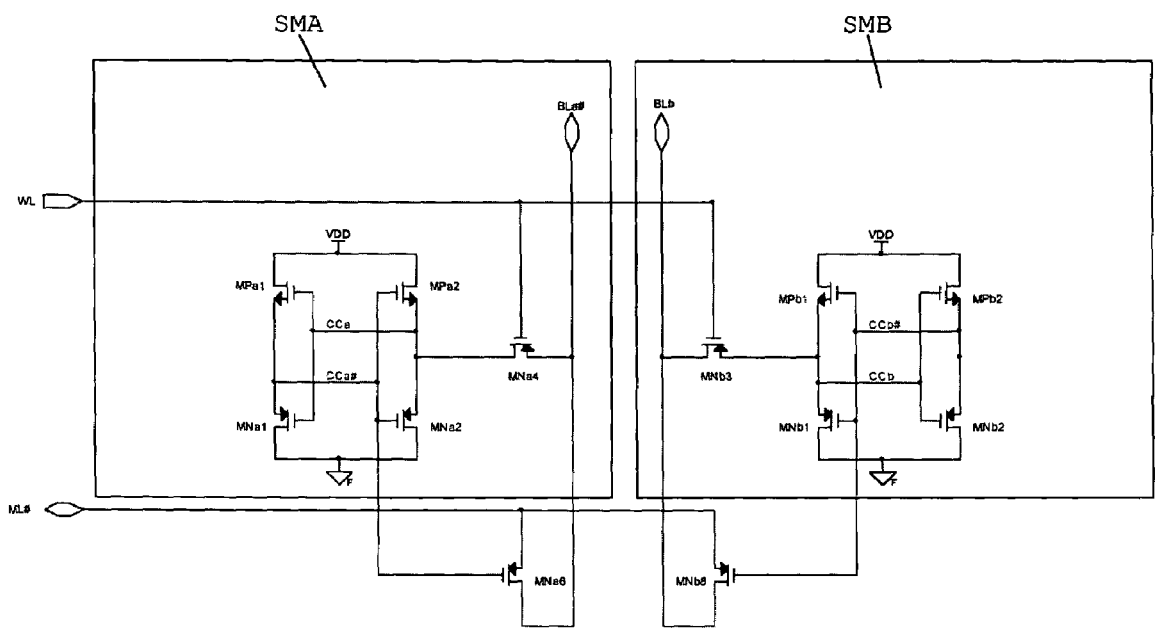

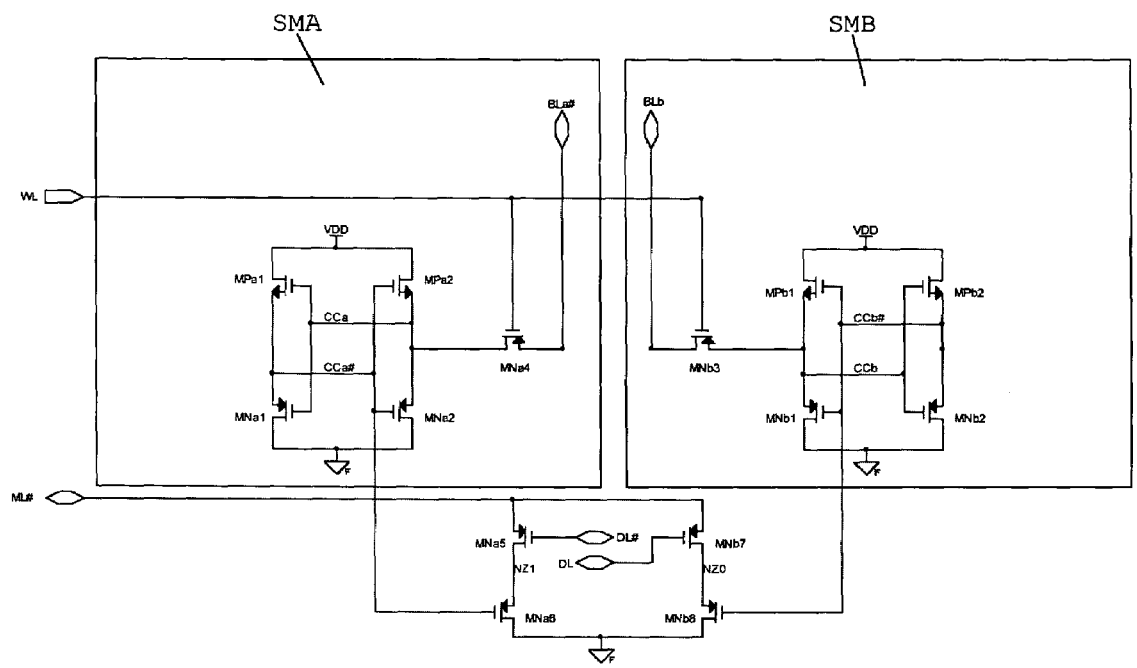
FIG. 4(g) 14 transistor TCAM cell with independent lookup port

FIG. 4(h) 12 transistor TCAM cell with independent lookup port
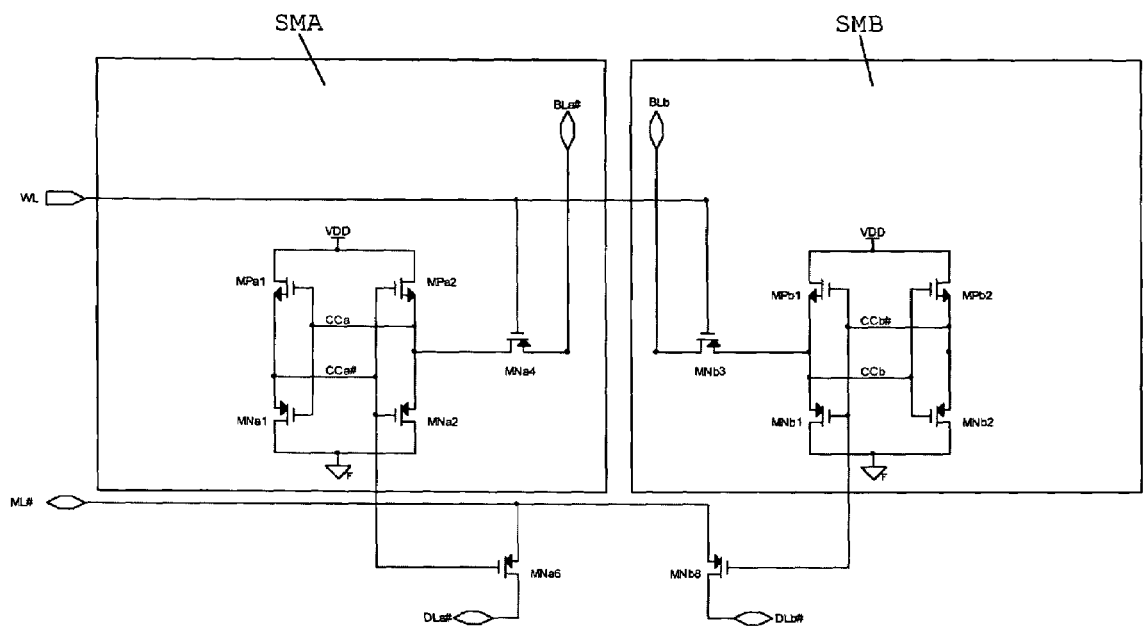

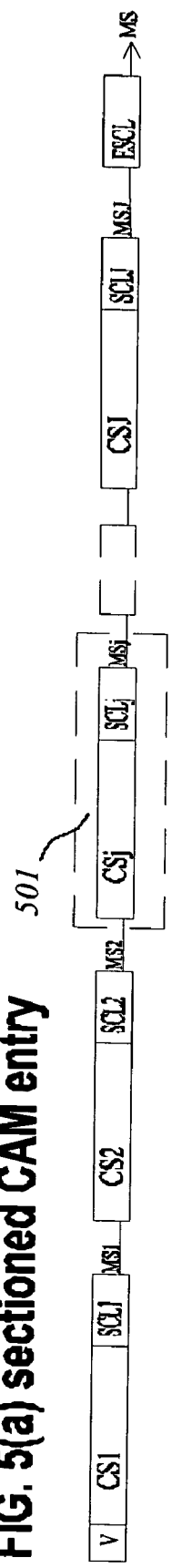
FIG. 5(a) sectioned CAM entry
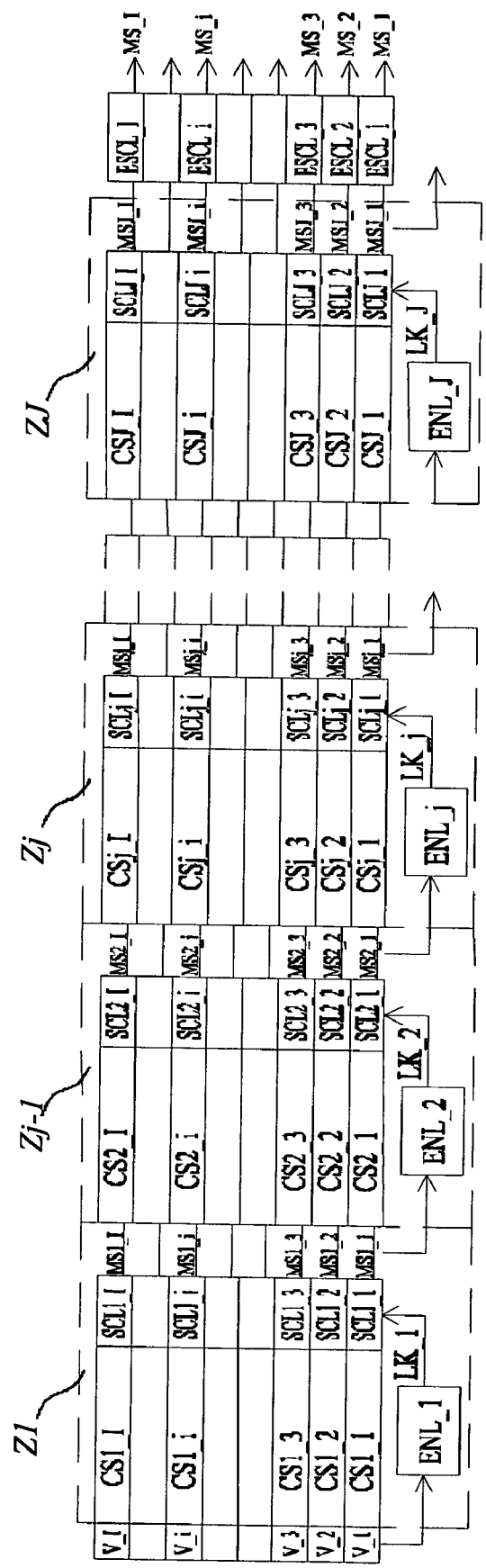
FIG. 5(b) zoned CAM

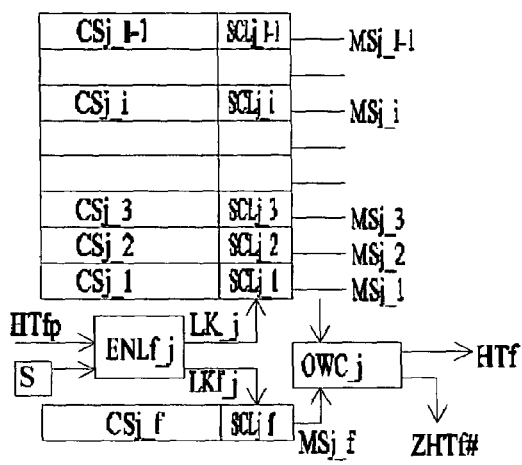
FIG. 5(c) F zone
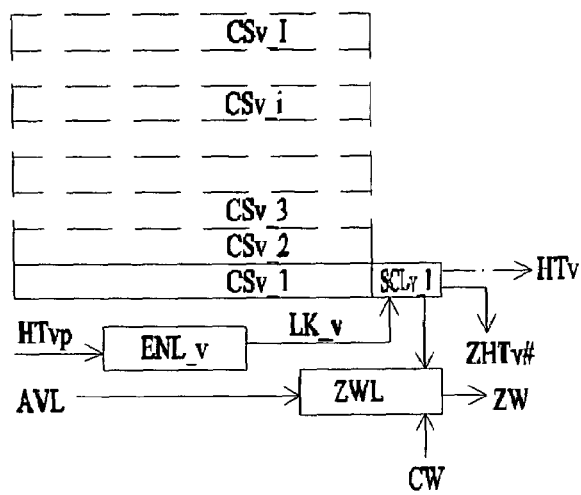
FIG. 5(d) V zone
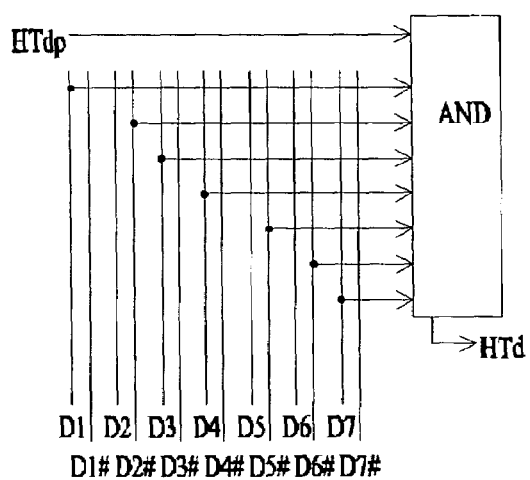
FIG. 5(e) D zone
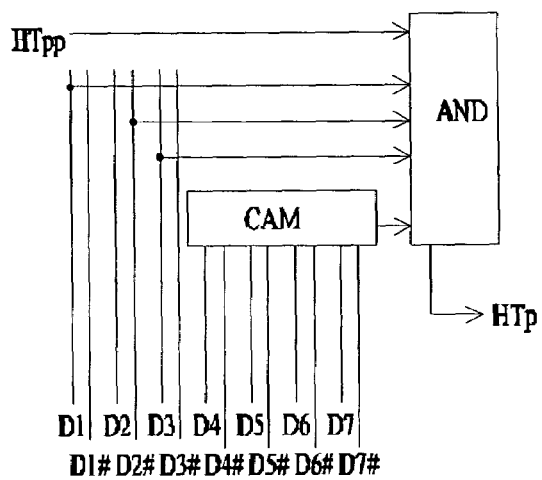
FIG. 5(f) P zone

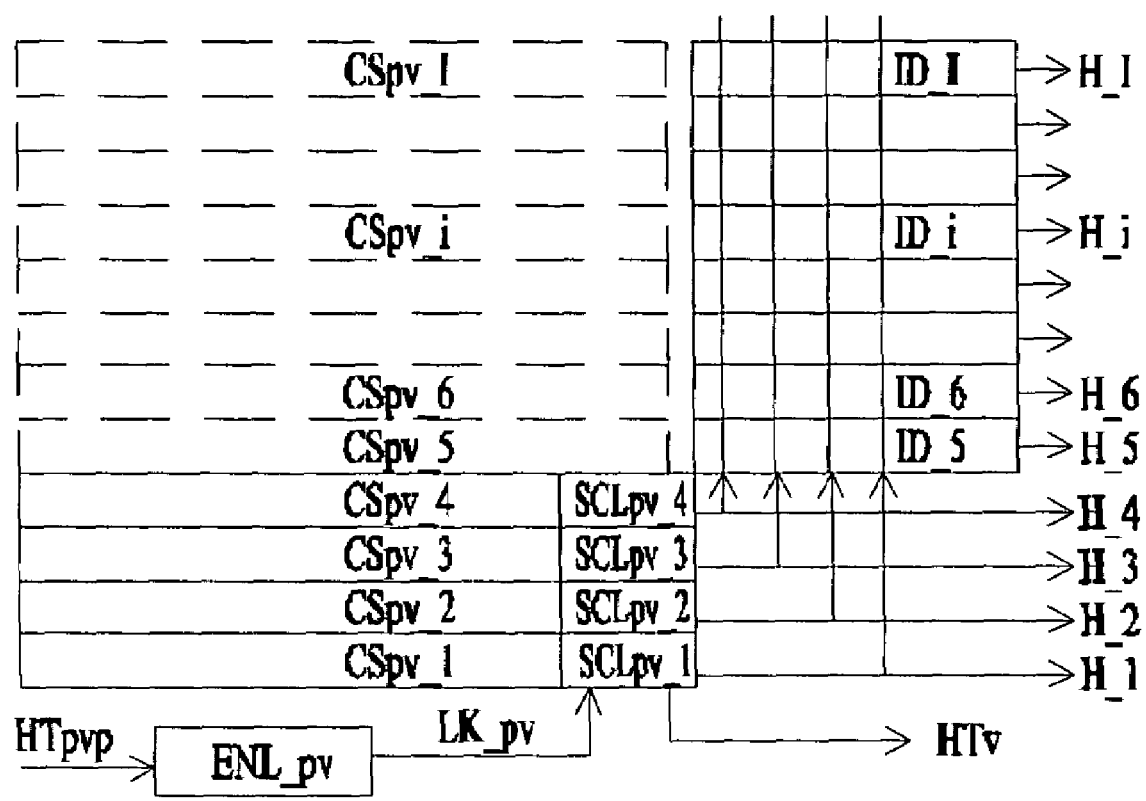
FIG. 5(g) PV zone

FIG. 5(h) Add/Remove Entry
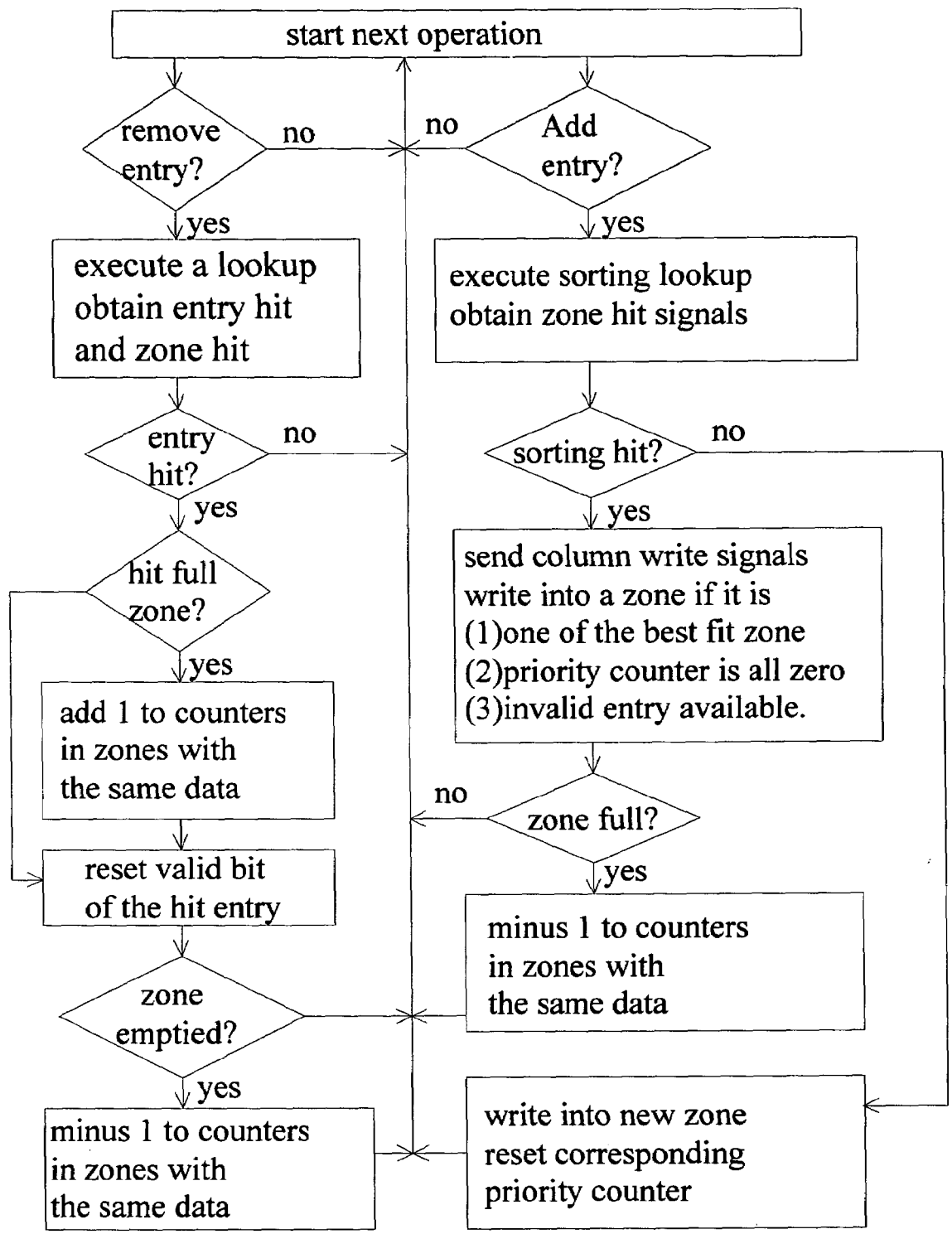

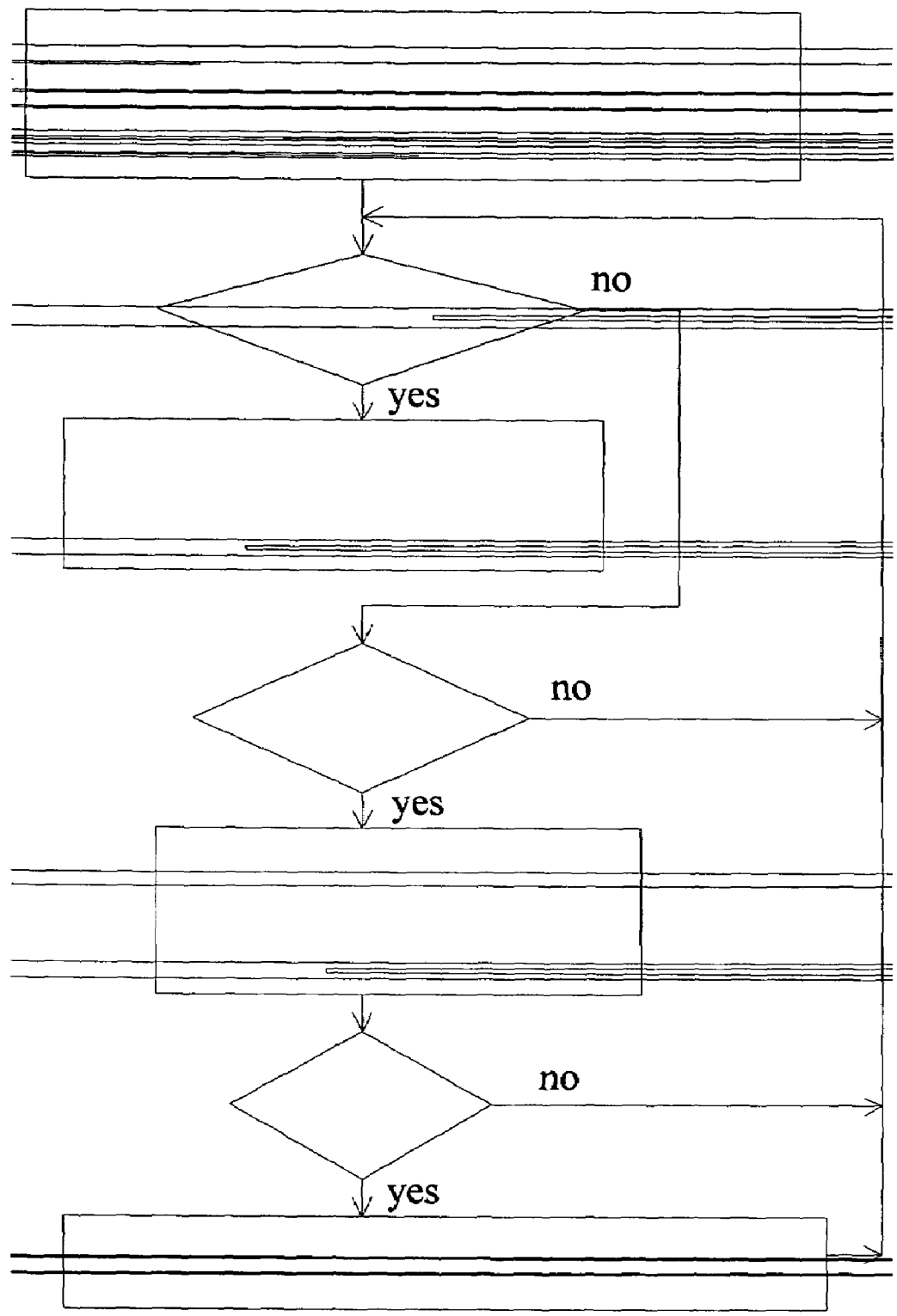
FIG. 5(i) CDR update

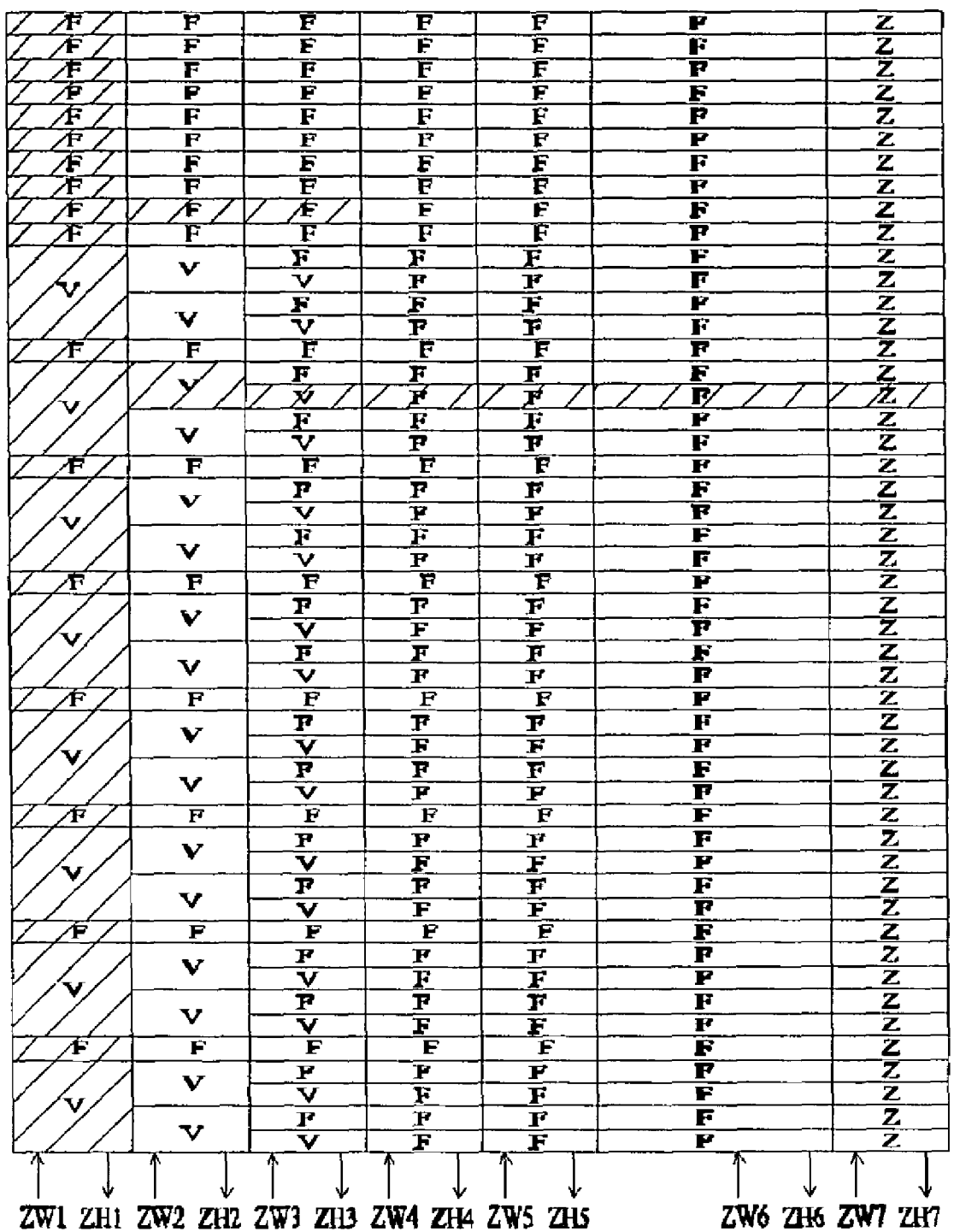
FIG. 6 Symbolic overview

METHODS FOR SAVING POWER AND AREA FOR CONTENT ADDRESSABLE MEMORY DEVICES

This Application is Continuation-in-Part (CIP) of a previously filed application Ser. No. 10/057,425 filed on Jan. 25, 2002, now U.S. Pat. No. 6,674,660, application Ser. No. 10/057,425 claims a Priority Date of Jan. 7, 2002, benefited from a previously filed Provisional Application with a serial number to be assigned filed on Jan. 7, 2002 by the same Applicant of this patent application.

BACKGROUND OF THE INVENTION

1. Field of the Invention

The present invention relates to content addressable memory (CAM) devices, and more particularly to power and area saving methods for CAM integrated circuits (IC).

2. Description of the Prior Art

Content address memory (CAM) is a useful device for executing table lookup operations. Particularly, because of the parallel lookup capability, a user can execute thousands or even millions of comparisons with one lookup operation.

For computer systems, CAM is widely used as the address lookup table (called cache TAG) for cache memory, or as the paging translation look-aside table (TLB). These CAM devices for computer applications are relatively small comparing to other IC components, so that the cost and power consumption are relatively insignificantly in a computer system.

For communication applications, CAM is widely used to support address lookup operations for routers. Recently, the rapid growths of networking systems triggered strong demands for high density and high speed CAM devices. A typical current art CAM for networking application has 256K of 72 bit entries supporting 125 million lookups per second (LPS). However, due to the parallel lookup operation of CAM devices, the power consumption of a CAM device increases linearly with its density and lookup rate. In the mean time, the cost of each CAM device increases exponentially with its area. The power consumption and costs of CAM devices are becoming the limiting factors for current art router systems. It is simply too expensive and requires too much power to put enough CAM devices on router systems to support desired performances. It is therefore an urgent need to provide power and area reduction methods for high-density CAM devices.

SUMMARY OF THE INVENTION

The primary objective of this invention is, therefore, to reduce the areas of high-density CAM devices. The other primary objective of this invention is to reduce the power consumed by high-density CAM devices. Another objective is to provide flexibility for binary and ternary CAM operations.

These and other objects are accomplished by novel improvements in the CAM memory cells as well as CAM lookup operations.

While the novel features of the invention are set forth with particularly in the appended claims, the invention, both as to organization and content, will be better understood and appreciated, along with other objects and features thereof, from the following detailed description taken in conjunction with the drawing.

BRIEF DESCRIPTION OF THE DRAWINGS

FIG. 1(a) is a schematic diagram for prior art 10 transistor binary CAM (BCAM) cell;

FIG. 1(b) illustrates the structure of a prior art CAM entry;

FIG. 1(c) shows the miss line logic circuit used by the CAM entry in FIG. 1(b);

FIG. 1(d) illustrates the overall architecture of a prior art CAM device;

FIG. 2(a) is a schematic diagram for a prior art ternary CAM (TCAM) cell;

FIG. 2(b) is the schematic diagram for another prior art TCAM cell;

FIG. 3(a) is the schematic diagram for a 6T BCAM cell of the present invention;

FIG. 3(b) illustrates a CAM entry comprising the CAM cells in FIG. 3(a);

FIG. 3(c) is the schematic diagram for the select/compare (SC) line logic circuit of the CAM entry in FIG. 3(b);

FIG. 3(d) illustrates the structures for a CAM device of the present invention;

FIG. 3(e) shows the random access memory (RAM) disclosed in prior patent of the present inventor;

FIG. 3(f) shows a CAM cell of the present invention equipped with enable signal;

FIG. 3(g) is the schematic diagram for the select/compare (SC) line logic circuit equipped with a diode as the pull-up device against lookup overwrite problem;

FIGS. 3(h–j) are schematic diagrams for TCAM cells of the present invention using 5-transistor (5T) memory cells with single-bit-line-write (SBLW) capability;

FIGS. 4(a–d) are schematic diagrams for TCAM cells of the present invention;

FIGS. 4(e–h) are schematic diagrams for TCAM cells of the present invention using 5-transistor (5T) memory cells of our previous inventions;

FIG. 5(a) illustrates the structure for a sectioned entry of the present invention;

FIG. 5(b) illustrates the structure for the power saving zones of the present invention;

FIG. 5(c) shows the structure of "F zone";

FIG. 5(d) shows the structure of "V zone";

FIG. 5(e) shows the structure of "D zone";

FIG. 5(f) shows the structure of "P zone";

FIG. 5(g) shows the structure of "VP zone"

FIG. 5(h) shows the procedures for adding or removing entries from a CAM device of the present invention;

FIG. 5(i) is a float chart for common data register operations; and

FIG. 6 shows the architecture for a CAM device of the present invention equipped with power saving features illustrated in previous figures.

DETAILED DESCRIPTION OF THE INVENTION

The basic structures and the basic operations of prior art CAM devices are first discussed to facilitate understanding of the present invention.

FIG. 1(a) is a schematic diagram showing the structure of a prior art 10-transistor (10T) binary CAM cell. Two p-channel transistors (MP1, MP2) and two n-channel transistors (MN1, MN2) are connected as back-to-back inverters to form a bi-stable memory element with two complementary storage nodes (CC, CC#). One storage node (CC) of the memory element is connected to the drain of an n-channel select transistor (MN3). Two complementary data input lines (BL, BL#), called bit line pair in current art, provide data inputs/outputs to the CAM cell. The source of MN3 is connected to bit line (BL) for data transfer, while its gate is connected to word line (WL) for selecting the memory element. The other complementary storage node (CC#) of the memory element is connected to the drain of another n-channel select transistor (MN4). The source of MN4 is connected to the complementary bit line (BL#) for data transfer, while its gate is connected to word line (WL) for selecting the memory element. These 6 transistors (MP1, MP2, MN1, MN2, MN3, MN4) are arranged in the same ways as a conventional six transistor (6T) static random access memory (SRAM) memory cell. Data can be written into or read from such 6T SRAM cells by putting data on the complementary bit line pair (BL, BL#) while turning on the corresponding word line (WL), in the same ways as conventional SRAM operations. The additional 4 transistors (MN5–7) in this 10T CAM cell are needed for lookup operations. The gate of n-channel transistor MN5 is connected to BL, and its drain is connected to signal ML#. ML# is called as the "Miss Line" because it would be pulled low when there is a "miss" (difference in data) in comparison. The gate of n-channel transistor MN6 is connected to storage node CC#, and its source is connected to ground voltage. The drain of MN6 is connected to the source of MN5. The gate of n-channel transistor MN7 is connected to BL#, and its drain is connected to signal ML#. The gate of n-channel transistor MN8 is connected to storage node CC, and its source is connected to ground voltage. The drain of MN8 is connected to the source of MN7. These 4 transistors (MN5–7) perform an exclusive OR (XOR) logic operation between the complementary storage data (CC, CC#) and the input data placed on the bit line pair (BL, BL#). They are called "XOR structure" in the following discussion. If the storage data (CC, CC#) and the input data (BL, BL#) have different complementary digital values, either the MN5/MN6 or the MN7/MN8 pairs of the XOR structure will form a conducting path to pull the voltage on the miss line (ML#) toward ground voltage. The compared result is called a "miss" under this condition. If the storage data (CC, CC#) and the input data (BL, BL#) have the same complementary digital values, both MN5/MN6 and MN7/MN8 pairs remain at high impedance state with no signal current flow from the miss line (ML#) through this CAM cell. The result obtained under this situation is called a "match". One 10T cell in FIG. 1(a) is therefore capable of performing single bit comparison. A "match" is represented by high impedance state on the miss line (ML#), while a "miss" is represented by pull down current by the XOR structure of the 10T CAM cell.

For multiple bit comparisons, a plurality of 10T cells are arranged into a lined structure (called an "entry" in current art) as illustrated in FIG. 1(b). Each CAM cell (C1, C2, . . . Cn) in an entry has its own bit line pair (BL1, BL1#, BL2, BL2#, . . . BLn, BLn#) while sharing the same word line (WL) and the same miss line (ML#) with other CAM cells in the same entry. A set of n-bit binary data can be written into or read from the storage nodes of these CAM cells by activating the word line (WL) in the same ways as SRAM operations. Simultaneous n-bit comparison can be executed by placing the n-bit comparison data into those n pairs of bit lines. If one or more than one bit of the n-bit inputs are different from the stored data, the miss line (ML#) would be pulled toward ground voltage by the XOR structures in the CAM cells with mismatched data. If all bits in the CAM entry matches, the miss line (ML#) would remain at high impedance state because all the XOR structure in the CAM cells are at high impedance states. Typically, the miss line (ML#) is connected to a miss line logic circuit (MLC) as shown in FIG. 1(b). One example of MLC is shown in FIG. 1(c). A p-channel transistor (MPm1) and an n-channel transistor (MNm1) form an inverter to detect the value of the binary data on the miss line (ML#) and provides an inverted output signal (ML). Another p-channel transistor (MPm2) with weak driving capability and another n-channel transistor (MNm2) with weak driving capability form a feedback inverter to hold the value of the binary data on the miss line (ML#). A p-channel transistor (MPm3) is used to setup the initial voltage on the miss line (ML#). Before lookup operation, the pre-charge signal (PCG#) is pull low so that MPm3 would set miss line initial voltage to high. The values of all the bit line pairs (BL1, BL1#, BL2, BL2#, . . . BLn, BLn#) are all set to low so that there is no power consumed at initial state. To start a lookup operation, PCG# is pulled high, while compared data are placed on bit line pairs (BL1, BL1#, BL2, BL2#, . . . BLn, BLn#). If there are one or more than one bit mismatch on the entry, the miss line (ML#) would be pulled low, while MLC output (ML) would be pulled high. If there is a perfect match, the miss line (ML#) remains at high voltage, while the output signal (ML) remains at low.

The power consumption of a lookup operation is dependent on the result of the comparison. When the result is a "match", little power is consumed because all the circuits in the CAM entry remain at their initial states. The power consumption is much higher for a "miss" because of the pull down on the miss line (ML#) and the following switching circuits.

The symbolic block diagram in FIG. 1(d) illustrates the overall structure of a prior art CAM device. Typically, a CAM device comprises a CAM array (101) and a RAM array (103). The RAM array (103) is a traditional random access memory. Each row (105) of the RAM array stores data corresponding to each entry (107) of the CAM array. The CAM array (101) comprises a plurality of CAM entries (107) similar to the CAM entry illustrated in FIG. 1(b). The CAM entries (107) along the same column share the same set of bit line pairs (BL1, BL1#, BL2, BL2#, . . . BLn, BLn#) so that data comparisons can be executed on all the entries simultaneously. Each CAM entry has its own word line (WL) for selecting individual entry for data write/read operations. Each CAM entry has an output (ML) indicating the results of comparison. This output ML is used to select corresponding data row (105) in the RAM array (103). Since the data stored in each entry are different from the data stored in all other entries, for each lookup operation, one or none of the entries can have a matched result. The resulting match signal is used to select one row of data from the RAM array (103) as the output for further operations. The miss signals (ML) are also used to create a HIT signal indicating whether a match was found in the CAM array or not.

The prior art CAM device illustrated in FIGs. 1(a–d) consumes extremely large amount of power when it contains a large number of entries. For each lookup operation, no more than one entry can match the lookup data. That means all or all but one of the entries are sinking current due to miss. The total power (Pwr) consumed by such prior art devices can be written as $$Pwr=[Nmiss*Pmiss+Ndata*Pbitline+Poh]*Lps \qquad (1),$$

where Nmiss is the number of entries in the CAM array with "miss" results, Pmiss is the energy consumed by an entry when the result is "miss", Ndata is the number of bit line pairs, Pbitline is the energy needed to drive one pair of bit lines for each lookup operation, Poh is the power overhead needed for the lookup operation such as the power needed for logic operations and input/output (I/O) operations, and Lps is the number of lookups executed per second. For a typical prior art CAM, the first term Nmiss*Pmiss in Eq. (1) is the dominating term. Most of the power is consumed to pull down the miss lines in the CAM entries.

The prior art CAM cell in FIG. 1(a) is called a "binary CAM" (BCAM) cell because it can have only two logical states—'0' or '1'. For practical table lookup operations, we often need another logical state—"don't care"; that means the comparison result is always a match no matter what is the binary state of the input data. FIG. 2(a) shows a prior art "ternary CAM" (TCAM) cell that can support three comparison results—miss/match/"don't care". The connections of the top 10 transistors (MP1, MP2, MN1–MN8) are identical to the BCAM cell in FIG. 1(a) except that the sources of MN6 and MN8 are connected to the drain of an n-channel transistor (MN9), instead of ground. The source of MN9 is connected to ground, while its gate is connected to the storage node (CCe) of another memory element (EB). For the example in FIG. 2(a), EB comprises 2 p-channel transistors (MPe1, MPe2) and 4 n-channel transistors (MNe1, MNe2, MNe3, MNe4) arranged in the same ways as conventional 6T SRAM memory cell. EB uses its own word line (WLe), while it shares the same bit line pairs (BL, BL#) with the CAM storage cell on top of it. When a binary number '1' is written into EB, CCe is high so that MN9 is conductive; the XOR structure (MN5–MN8) is enabled so that the TCAM cell in FIG. 2(a) supports the same functions as that of the BCAM cell in FIG. 1(a). When a binary number '0' is written into EB, CCe is low so that the XOR structure (MN5–MN8) is always disabled; the comparison result is always a "match". The TCAM cell in FIG. 2(a) is therefor able to support the "don't care" state. This TCAM cells can be arranged in the same architectures as those described in FIGS. 1(b–d) to form a high density TCAM device supporting simultaneous lookup of large numbers of ternary logic data.

FIG. 2(b) shows another example of prior art TCAM cell. This TCAM cell comprises two side-by-side memory elements (MA, MB). The first memory element (MA) comprises 2 p-channel transistors (MPa1, MPa2) and 4 n-channel transistors (MNa1, MNa2, MNa3, MNa4) arranged in the same ways as conventional 6T SRAM memory cell. The second memory element (MB) also comprises 2 p-channel transistors (MPb1, MPb2) and 4 n-channel transistors (MNb1, MNb2, MNb3, MNb4) arranged in the same ways as conventional 6T SRAM memory cell. These two memory elements (MA, MB) share the same word line (WL) while using their own bit line pairs (BLa, BLa#, BLb, BLb#). An XOR structure comprises 4 transistors (MNa5, MNa6, MNb7, MNb8) is placed between those two memory elements (MA, MB). The gate of MNa5 is connected to BLa#, the gate of MNa6 is connected to one of the storage node (CCa) of the first memory element (MA), the gate of MNb7 is connected to BLb, and the gate of MNb8 is connected to one of the storage node (CCb#) of the second memory element (MB). By placing data into the bit line pairs (BLa, BLa#, BLb, BLb#) and activating the word line (WL), digital data can be written into both memory elements (MA, MB) simultaneously. Digital value '1' is represented by storing '1' into both MA and MB; digital value '0' is represented by storing '0' into both MA and MB; while the "don't care" state is represented by storing '0' into MA and '1' into MB. Lookup operation is executed by placing lookup data value on BLb and the complemented data on BLa#. If the stored value is "don't care", the miss line (ML#) always stay at high impedance state. If the stored value matches the lookup value, ML# also stay at high impedance state. If the stored value is different from the lookup value, ML# is pulled toward ground voltage. This TCAM cell actually support the forth state—"always miss" by storing '1' into MA and '0' into MB. Such "always miss" state is seldom used in practical applications. This 16 transistor TCAM cell in FIG. 2(b) also can be arranged in the same architectures as those described in FIGS. 1(b–d) to form a high density TCAM device supporting simultaneous lookup of large numbers of ternary logic data.

The prior art TCAM cells in FIGS. 2(a,b) provide additional flexibility in table lookup, but they suffer the same power consumption problems as the prior art BCAM cell in FIG. 1(a). The areas of TCAM are typically more than 50% larger than BCAM of the same density.

The present invention introduces novel CAM cells to provide significant area reduction. FIG. 3(a) illustrates a 6-transistor (6T) BCAM cell of the present invention. Two p-channel transistors (MPc1, MPc2) and two n-channel transistors (MNc1, MNc2) are connected as back-to-back inverters to form a bi-stable memory element with two complementary storage nodes (CM, CM#). One storage node (CM) of the memory element is connected to the drain of an n-channel transistor (MNc3). The source of MNc3 is connected to a signal (MLw#) that serves the functions of miss line and word line of prior art CAM cells, and it is called the "Select and Compare" (SC) line of the present invention. There is a pair of complementary input lines (D, D#) with similar functions as prior art bit line pair (BL, BL#). The gate of MNc3 is connected to data line (D). The complementary storage node (CM#) of the memory element is connected to the drain of another n-channel transistor (MNc4). The source of MNc4 is also connected to the SC line (MLw#). The gate of MNc4 is connected to the complementary data line (D#).

Similar to conventional 6T SRAM cells, the sizes of transistors (MPc1, MPc2, MNc1, MNc2, MNc3, MNc4) in this 6T BCAM cell are chosen in such ways that it is impossible to change the states of the storage nodes (CM, CM#) when the voltage on MLw# is higher than a critical write voltage (Vwr). To write a digital data '1' into the cell, we need to pull the voltage on MLw# to a value lower than Vwr, and pull up D# line while keeping D line at ground voltage. To write a digital data '0' into the cell, we need to pull the voltage on MLw# to a value lower than Vwr, and pull up D line while keeping D# line at ground voltage. In other words, inverted complementary data are placed on the data line pair (D, D#) during a data write operation. Since data write operation can happen only when the SC line (MLw#) is pulled down, the SC line can be used to serve the function of conventional word line for selective writing purpose. To execute a lookup operation, the SC line (MLw#) is pre-charged to high voltage, and a set of complementary digital data are placed on the data line pairs (D, D#) for comparison. When the data on (D, D#) are (1,0) while the data in the storage nodes (CM, CM#) are (1,0), the SC line remains at high voltage, indicating a match on the comparison. When the data on (D, D#) are (0,1) while the data in the storage nodes (CM, CM#) are (0,1), the SC line remains at high voltage, also indicating a match on the comparison. When the data on (D, D#) are (1,0) while the data in the storage nodes (CM, CM#) are (0,1), the SC line is pulled down toward ground voltage, indicating a miss on the comparison. When the data on (D, D#) are (0,1) while the data in the storage nodes (CM, CM#) are (1,0), the SC line is pulled down toward ground voltage, also indicating a miss on the comparison. Under such single bit comparison, the SC line (MLw#) behaves in the same way as the miss line (ML#) of prior art CAM cells. In other words, the 6T BCAM cell in FIG. 3(a) is able to serve the same single bit comparison functions as the 10T BCAM cell in FIG. 1(a) while the 6T CAM cell of the present invention occupies much smaller area.

For multiple bit comparisons, multiple 6T BCAM cells are lined into an entry in a way similar to prior art CAM entry as illustrated in FIG. 3(b). Each 6T BCAM cell (B1, B2, . . . Bn) has its own data line pair (D1, D1#, D2, D2#, . . . Dn, Dn#) while sharing the same SC line (MLw#) with all other cells in the same entry. A set of n-bit binary data can be written into the storage nodes of these 6T BCAM cells by pulling the SC line (MLw#) lower than Vwr while placing inverted binary data on the data line pairs (D1, D1#, D2, D2#, . . . Dn, Dn#). Simultaneous n-bit comparison can be executed by placing the n-bit comparison data into those n pairs of data lines after the SC line is pre-charged to a high voltage. If all the data match with the storage data, the voltage on the SC line would remain the same. If one or more than one bit of the n-bit inputs are different from the stored data, the SC line voltage would be pulled toward ground voltage by 6T BCAM cells with mismatched data. It is very important to prevent the voltage on the SC line from going lower than Vwr during a multiple bit lookup operation; otherwise the storage data of the matched bits may be over-written by the missed bits during the look-up operation. Such problem is called the "lookup overwrite problem" of the present invention. There are many practical methods to prevent the lookup overwrite problem. One method is to turn off the lookup operation by resetting the voltages on all the data line pairs to zero after miss/match has been determined but before the voltage on the SC line can drop below Vwr. Another method is to provide a pull-up device on the SC line so that the voltage on the SC line can never go under Vwr during a lookup operation.

Similar to the prior art CAM entry in FIG. 1(b), the 6T BCAM entry in FIG. 3(b) also can have an SC line logic circuit (SCL) to detect the miss/match results for each entry. One example of SCL is shown in FIG. 3(c). A p-channel transistor (MPw1) and an n-channel transistor (MNw1) form an inverter to detect the value of the binary data on the SC line (MLw#) and provides an inverted output signal (MLw). Another p-channel transistor (MPw2) with weak driving capability and another n-channel transistor (MNw2) with weak driving capability form a feedback inverter to hold the value of the binary data on the input node (HT) of the sensing inverter. A p-channel transistor (MPw3) is used to setup the initial voltage on HT. So far, the structure of this SC line logic circuit is the same as the miss line logic circuit in FIG. 1(c). Additional circuits are added to support write and lookup operations of the present invention. The SC line (MLw#) is connected to HT through an n-channel transistor (MNw3). The gate of MNw3 is controlled by a lookup control signal LK. The SC line (MLw#) is also connected to the drain of an always-on n-channel transistor (MNw4). The source of MNw4 is connected to a decoded control signal (WR#). At idle state, WR# is pulled high to pre-charge the SC line, and the pre-charge control signal PCG# is pulled low to initialize HT node to high. For a write operation, control signal LK is at ground voltage, while the decoded control signal WR# is pull down to a voltage lower than write critical voltage Vwr. Inverted digital data are placed on data line pairs (D1, D1#, D2, D2#, . . . Dn, Dn#) to write data into the storage nodes of the 6T BCAM cells (B1, B2, . . . Bn) in the entry. For a lookup operation, control signal LK is pulled high, PCG# is also pulled high, WR# remains high, while compared data set is placed on data line pairs (D1, D1#, D2, D2#, . . . Dn, Dn#). If there is a match, the SC line (MLw#) voltage remains at high, and the output signal MLw remains at low. If there is one or more miss bits, the SC line (MLw#) would be pulled toward ground to a voltage lower than the trigger voltage (Vtr) of the detecting inverter (MPw1, MNw1), so that the output signal MLw would be pulled to high, indicating a miss is detected. In the mean time, transistor MNw4 has enough pull-up capability to prevent the SC line voltage get lower than Vwr in order to prevent the lookup overwrite problem. Once the lookup results have been determined, the LK signal and all the data line pairs (D1, D1#, D2, D2#, . . . Dn, Dn#) are pulled to ground voltage to prevent wasting power while allowing the lookup results to be latched.

The symbolic block diagram in FIG. 3(d) illustrates the overall structure of a CAM device of the present invention. This CAM device also comprises a CAM array (301) and a RAM array (303). The CAM array (301) comprises a plurality of CAM entries (307) similar to the CAM entry illustrated in FIG. 3(b). The CAM entries (307) along the same column share the same set of data line pairs (D1, D1#, D2, D2#, . . . Dn, Dn#) so that data comparisons can be executed on all the entries simultaneously. Each CAM entry has its own SC line (MLw#) for selecting individual entry for data write/read operations as well as detecting miss/match for each entry. Each CAM entry has an output (MLw) indicating the results of comparison. This output MLw is used to select corresponding data row (305) in the RAM array (303). Since the data stored in each entry are different from the data stored in all other entries, for each lookup operation, one or none of the entries can have a matched result. The resulting match signal is used to select one row of data from the RAM array (303) as the output for further operations. The miss signals (MLw) are also used to create a HITw signal indicating whether a match was found in the CAM array or not.

The BCAM cell of the present invention shown in FIG. 3(a) uses 6 transistors, while the prior art BCAM cell shown in FIG. 1(a) uses 10 transistors. In addition, prior art CAM cell require two horizontal lines (WL and ML#) while the 6T BCAM cell needs only one horizontal line (MLw#). Therefore, the 6T BCAM devices occupy much smaller areas than prior art 10T BCAM devices.

The novel structures for CAM cells of the present invention is to use data controlled pass gate devices (DCPG), such as transistors MNc3 and MNc4 shown in FIG. 3(a), to replace the XOR structures (MN5–8) and cell select transistors (MN3–4) of prior art CAM cells. Using SCPG structures, the same transistor is used to support both CAM lookup operations as well as CAM cell write operations. It is also possible to use the same metal line to support both types of operations. The resulting CAM devices can support all the functions of prior art devices while using much less area. The price to pay for this area reduction is the need to avoid the lookup overwrite problem.

If we view the data lines as the word lines (WL1, WL2), and the SC line as connected bit lines (BL1, BL2), then the structure of the 6T BCAM cell of the present invention is actually identical to the 6T dual port RAM cell shown in FIG. 3(e). Operation principles of the RAM cell in FIG. 3(e) have been discussed in details in a patent published by the present inventor (U.S. Pat. No. 09/938,431). Since the 6T BCAM cell is identical to RAM cell, we can operate the CAM devices of the present invention as if they are RAM devices by treating data lines as RAM word lines, while treating SC lines as RAM bit lines. Using the CAM device in FIG. 3(d) as an example, if we activate data line D1 while keeping all the other data lines at ground voltage, we will be able to write data into or read data from one column of data into all the memory cells along D1 by treating all the SC lines as bit lines. These column read/write operations can be applied on any column in the CAM array by activating proper data line as word line, and the CAM array will function as if it is a RAM array.

The SCL is shown in FIG. 3(c) uses an n-channel pull-up transistor (MNw4) to prevent lookup overwrite problem. That circuit works fine to support a small number of CAM cells, but MNw4 is not strong enough to support large number of CAM cells. One method to solve the problem is to use a diode (DIOD1) as the pull-up device as shown in FIG. 3(g). Another area saving method is to keep the XOR structure while relying the RAM cell in FIG. 3(e) to reduce gate count. FIG. 3(h) shows a 9 transistor (9T) BCAM cell of the present invention. This 9T cells is almost identical to the prior art 10T cell in FIG. 1(a) except that one of the select transistor (MN4) is removed for area-saving purpose. Removal of MN4 is made possible by the single-bit-line-write (SBLW) techniques as that disclosed in two co-pending patent application Ser. Nos. 09/938,431 and 10/116,787 filed by the Applicant of this invention. These two patent application Ser. Nos. 09/938,431 and 10/116,787 are hereby incorporated as references in the present patent application. The BCAM cell in FIG. 3(h) can be further simplified into the 8T cell in FIG. 3(i) which needs only one bit line (BL) to support read, write, and lookup operations. FIG. 3(j) shows another embodiment by changing the cell of FIG. 3(i) by using the bitline BL to support operations of memory read and write while using a separated data line (DL) to support CAM lookup operations. It is therefore possible to execute CAM lookup in parallel with CAM read/write operations using the cell in FIG. 3(j).

While specific embodiments of the invention have been illustrated and described herein, it is realized that other modifications and changes will occur to those skilled in the art. For example, we can replace all the n-channel transistors with p-channel transistor, while replacing all the p-channel transistors with n-channel transistors to build similar circuits. With minor modifications, it would be very easy to build a wide variety of CAM cells based on the DCPG structures disclosed in FIGS. 3(a–c). For example, FIG. 3(f) illustrates a 7-transistor (7T) BCAM cell of the present invention. The structure of this 7T cell is similar to the 6T BCAM cell in FIG. 3(a) except that one more transistor (MNc5) is added between the drains (Z0) of data controlled pass gate transistors (MNc3, MNc4) and the SC line (MLw#). The gate of MNc5 is controlled by an enable signal (EN). This 7T cell behaves in the same way as the 6T BCAM cell in FIG. 3(a) when EN is high. When EN is low, the 7T CAM cell is isolated from external signals. This added transistor provides an efficient way to halt a lookup operation as a method to avoid lookup overwrite problem; it also provides convenient options to support power saving mechanisms. Another example is to separate the SC line in each entry into two lines so that each CAM cell of the present invention also can function as a dual port RAM cell.

Using the 6T BCAM cells in FIG. 3(a) as building blocks, TCAM cells can be built with unprecedented flexibility. FIG. 4(a) shows one example of a 12-transistor TCAM cell of the present invention. This TCAM cell of the present invention comprises two side-by-side 6T BCAM cells (ML, MR). Each BCAM cell (ML, MR) has its own data line pairs (DL, DL#, DR, DR#) while sharing the same SC line (MLw#). The write operation of this TCAM cell is the same as writing into two BCAM cells simultaneously. This TCAM cell also can be treated as two dual port RAM cells for column read/write operations. The ternary lookup operations for this TCAM cell can be done in many ways. For example, we can put binary data on DL and DR# for lookup operation, while keeping DL# and DR at ground voltage during lookup. If the data stored in the storage nodes (CL, CR#) are (1, 1), it is at "don't care" state, and the lookup results will always be "match" no matter what are the data placed on lookup data lines (DL, DR#). If the data stored in the storage nodes (CL, CR#) are (1, 0), while the data placed on (DL, DR#) are also (1, 0), there is a match. If the data stored in the storage nodes (CL, CR#) are (1, 0), while the data placed on (DL, DR#) are (0, 1), there is a miss, and the SC line (MLw#) would be pulled toward ground voltage. If the data stored in the storage nodes (CL, CR#) are (0, 1), while the data placed on (DL, DR#) are also (0, 1), there is a match. If the data stored in the storage nodes (CL, CR#) are (0, 1), while the data placed on (DL, DR#) are (1, 0), there is a miss, and the SC line (MLw#) would be pulled toward ground voltage. It is also possible to use (DL, DR), (DL#, DR#), or (DL#, DR) pairs for ternary lookup operations. The logic truth table of the ternary lookup at different configurations is shown in Table 1.

TABLE 1

| Lookup lines | (CL, CR) = (0, 0) | (CL, CR) = (0, 1) | (CL, CR) = (1, 0) | (CL, CR) = (1, 1) |
|---|---|---|---|---|
| (DL#, DR#) | Don't care | '1' | '0' | Always miss |
| (DL, DR#) | '0' | Always miss | Don't care | '1' |
| (DL#, DR) | '1' | Don't care | Always miss | '0' |
| (DL, DR) | Always miss | '0' | '1' | Don't care |

Since the TCAM cell in FIG. 4(a) is identical to two BCAM cells in FIG. 3(a), we certainly can convert any one TCAM cell into two BCAM cells in any part of a TCAM device of the present invention. Similarly, we can convert two nearby BCAM cells into one TCAM cell in any part of a BCAM device of the present invention. In other words, an array of 6T cells in FIG. 3(a) has the flexibility to function as TCAM, BCAM, RAM, dual port RAM, dual port CAM, or mixtures of those types of memories, and the mixtures can be changed at any time without any physical changes in circuits.

While specific embodiments of the invention have been illustrated and described herein, it is realized that other modifications and changes will occur to those skilled in the art. Based on the same principles, a wide variety of TCAM cells could be developed with minimum effort. FIG. 4(b) shows one example of modified TCAM cell. This TCAM cell is nearly identical to the TCAM cell shown in FIG. 4(a) except that two of the data line (DL#, DR) are replaced by a reset signal (RST), and that the sources of those two transistors (MNL4, MNR3) controlled by RST are connected to ground. Pulling up the RST signal will set this TCAM cell into "don't care" state. Other states can be written into this TCAM cell by pulling down SC line (MLw#) while setting proper values on the remaining data lines (DL, DR#). Lookup process is executed using DL and DR# in the same ways described in previous sections. This TCAM cell does not have the same flexibility as the cell in FIG. 4(a), but it is more convenient to set up "don't care" state.

FIG. 4(c) shows another variation for the TCAM cells of the present invention. This TCAM cell is similar to the TCAM cell shown in FIG. 4(a) except that two of the data line (DL#, DR) and the transistors (MNL4, MNR3) controlled by them are removed for area saving purpose. The structures of this 10-transistor (10T) TCAM cell is identical to two side-by-side 5 transistor (5T) RAM cells described in previous patent of the present inventor. In other words, this 10T TCAM cell also can function as two 5T RAM cells. The data write operations can be executed using the single-bit-line-write (SBLW) method described in previous patent application Ser. No. 09/938,431 and the disclosures of that Application is hereby incorporated as reference. The data read operations are also described in details in that patent. The TCAM lookup operation is executed using two data lines (Dt, Dt#) in the same ways as described in previous sections. This 10T TCAM cell provides TCAM devices with minimum area while supporting all the TCAM functions as prior art TCAM devices. In addition, it also supports column read/write features as if it is a RAM device.

Another variation of TCAM cell is shown in FIG. 4(d). This cell is very similar to the cell in FIG. 4(c) except that a transistor (MNLt4) controlled by enable signal (EN) is placed between the first data controlled pass gate (MNLt3) and corresponding storage node (CCL), while another transistor (MNRt4) controlled by EN is placed between the second data controlled pass gate (MNRt3) and corresponding storage node (CCR#). When the enable signal (EN) is high, the cell in FIG. 4(d) has the same functions as the cell in FIG. 4(c). When EN is low, the cell is isolated from external signals. These additional transistors (MNLt4, MNRt4) provide a method to stop activities on the TCAM cell using the enable signal (EN).

Utilizing data controlled pass gate devices (DCPG) to support CAM lookup operations, a series of novel CAM cells have been developed. These novel CAM cells provide significant area reductions that resulted in dramatic cost reduction for CAM devices. In addition, they dramatically improved the flexibility in CAM configurations. Other variations of novel CAM cells will become obvious for circuit designers upon disclosure of the above examples. The scope of the present invention is therefore not limited on detailed designs in CAM cells. Another area saving method is to keep the XOR structure while relying the RAM cell in FIG. 3(e) to reduce gate count. FIG. 4(f) shows a 14 transistor (14T) TCAM cell of the present invention. This 14T cells is almost identical to the prior art 16T cell in FIG. 2(a) except that two select transistors (MNa3, MNb4) are removed for area-saving purpose. Removal of those transistors is made possible by the single-bit-line-write (SBLW) teclniques disclosed in two co-pending patent application Ser. Nos. 09/938,431 and 10/116,787 filed by the applicant of this invention. These two patent application Ser. Nos. 09/938, 431 and 10/116,787 are hereby incorporated as references in the present patent application. The BCAM cell in FIG. 4(e) can be further simplified into the 12T cell in FIG. 4(f) which needs only two bit lines (BLa#, BLb) to support read, write, and lookup operations for the TCAM cell. FIG. 4(g) shows a variation of the cell in FIG. 4(e) which use bit lines (BLa#, BLb) to support memory read and write operation while using separated data lines (DL#, DL) to support the CAM lookup operation. It is therefore possible to execute CAM lookup in parallel with CAM read/write operations using the cell in FIG. 4(g). FIG. 4(h) shows a variation of the cell in FIG. 4(f) with independent lookup capability.

According to above descriptions and drawings, this invention discloses a content addressable memory (CAM) cell. The CAM cell includes a memory circuit having a memory node for storing a first digital data. The CAM cell further includes a data controlled pass-gate means connected to the memory node for receiving and writing a second digital data to the memory node and for comparing the second digital data with the first digital data. In a preferred embodiment, the CAM cell further includes a lookup overwrite protection circuit for preventing the write operation of the second digital data into the memory node.

Similar to prior art CAM devices, the above CAM entries of the present invention consume much more power when a lookup result is a "miss" rather than a "match". Since all but one entry in the whole CAM device would result in "miss", the power consumption is very large for communication CAM devices that require simultaneous lookup on thousands or even millions of entries. It is therefore necessary to develop power saving methods.

When a CAM entry is divided into a plurality of "sections", we know the lookup result of the whole entry would be "miss" if the lookup result of any one of its section is "miss". The present invention utilize this property to achieve power saving for high density CAM devices. FIG. 5(a) shows the structures of a sectioned CAM entry. A CAM entry is divided into a plurality of sections (CS1, CS2, . . . , CSj, . . . CSJ), where j and J are integers. Each section has a line of CAM cells, its own SC line logic (SCL1, SCL2, . . . , SCLj, . . . , SCLJ), and provides a lookup result (MS1, MS2, . . . , MSj, . . . , MSJ). Usually, each entry has a valid bit (V) indicating the corresponding entry is valid. An entry level SC logic (ESCL) takes the section outputs (MS1, MS2, . . . , MSj, . . . , MSJ) to provide the final lookup result (MS). The lookup result of an entry is "miss" when any one section lookup is "miss" or when the entry is not valid (V='0'). Only when V='1' and all section lookup results are "match", the entry output (MS) is "match". Power saving can be achieved if the lookup process is done section by section in series. If the lookup result of one section is a "miss", there is no need to waste more power continuing the lookup process because we already know the result for the whole entry would be a "miss". Only when all the results for all but the last section are "match" does the process continue through all the sections. Under that condition, the power consumption is low because "match" does not consume as much power. The power consumption of the whole lookup procedure is therefore reduced. The sections defined for sectioned lookup do not need to have equal number of bits. It would be wise to have fewer bits for sections that are checked earlier in the lookup procedure so that the sectioned lookup is likely to be stopped in a smaller section. Prior art CAM often used sectioned lookup as a method to implement pipelined lookup operations. However, prior art sectioned lookup did not achieve power saving because it does not stop useless lookup operations after a section miss.

The total time to finish a sectioned lookup maybe longer than the time to finish a prior art lookup without sections. However, the sectioned lookup can be pipelined to support multiple lookups simultaneously. The net performance measured in number of lookups per second (LPS) is therefore higher for sectioned lookups of the present invention. Each section needs to have its own detecting circuit and some logic circuit to stop existing lookup procedure. There will be area penalty for sectioned lookup due to those additional logic circuits.

One method to reduce the area overhead introduced by sectioned lookup is to group a plurality of sections into "zones" (Z1, Z2, . . . , Zj, ZJ) as illustrated in FIG. 5(b). A zone (Zj) of the present invention comprises a plurality of sections (CSj_1, CSj_2, . . . , CSj_i, . . . , CSj_I) from different entries. Each zone (Zj) also has an enable logic circuit (ENL_j) that takes the section lookup results of previous zone, and provides an lookup enable signal (LK_j) to its CAM sections. If the lookup results for all sections in previous zone (Zj-1) are all "misses", this enable logic circuit (ENL_j) will stop the lookup operation because we already know the lookup results of all CAM entries in this zone will be "miss". Otherwise, the enable logic circuit (ENL_j) starts the lookup procedure within this zone, and the next zone will determine whether to start lookup operation based on results obtained from this zone. Lookup operations are executed zone by zone so that such procedure is called "zoned lookup". This zoned lookup requires small area overhead because the supporting logic circuits are shared by many entries. These zones of the present invention do not need to have equal sizes, and they can mix with sectioned lookup at different locations to achieve optimum power/area savings. Sometimes a zone can have sub-zones treated in similar ways as sections.

With the helps of computer software or on-chip logic circuits, we can sort the contents of CAM array before the data are written into the CAM cells; entries with similar high order data bits can be placed near each other. When the sorted data are stored into sectioned CAM arrays, nearby sections in the same zone are likely to have the same data stored in high order sections. For example, a CAM array has 256K (K=1024) 64-bit entries; each entry is divided into 8-bit sections. After the data is sorted, on average the highest order 8-bit section will have 32K nearby sections containing identical data. It is a waste in power if we lookup all 256K sections simultaneously, while there are so many repeated patterns.

The present invention provides methods to save power for sorted CAM sections. The first method is to separate a section (CSj_f) (called "flag section") from the rest of sections (CSj_1, CSj_2, . . . , CSj_i, . . . , CSj_I-1) in the same zone, and place a flag (called "S flag") in that zone as shown in FIG. 5(c). Such zone is called flagged zone (F zone) of the present invention. The S flag is set when all the valid sections in this F zone contain identical data, and it is reset when any one of the valid sections contains data different from other valid sections. We do not need to take sections belong to invalid entries (V bit=0) into account because we know the lookup results of invalid sections are always "misses". The lookup enable logic circuit (ENLf_j) of an F zone takes S flag as well as the lookup result of previous zone (HTfp) as inputs. If HTfp indicates that the lookup results of previous zone are all miss, the lookup procedure will be stopped for power saving purpose. Otherwise, the lookup enable logic circuit would check the status of S flag. When the S flag is set, the lookup enable circuit (ENLf_j) would send out lookup command only to the flag section (CSj_f), while the rest of sections remain idle. An overwrite logic circuit (OWC_j) would tell the next zone that all the valid sections in this F zone have the same lookup results as that of the flag section. If the S flag is not set, the lookup enable circuit (ENLf_j) would start lookup procedures on all sections in this zone, and this F zone behaves in the same way as a usual zone. For a high density CAM array, almost all the S flag would be set for high order sections. The power consumed by an F zone would be about 1/Nf of that of a common zone, where Nf is the number of sections in the F zone. This number Nf is not necessary a constant for all zones. It would be wise to have F zones of different sizes along one column of CAM array to achieve optimum power saving effects. This "F zone" method is not effective for low order zones that are unlikely to have the same data stored in all sections. Therefore, F zones are usually implemented on high order zones when the CAM data are sorted. One variation of this F zone method is to have more than one flag sections in the same zone. For example, when we have two flag sections, we can have two different patterns stored in the zone while lookup operations are applied on those two flagged sections.

For a high density CAM array storing sorted data, the S flags of high order zones are almost always set. That means, besides flag sections, all the other sections in the high order zones are almost never used. It would be wise to remove those unused circuits to save area and power. FIG. 5(d) shows a virtual zone (V zone) of the present invention that contains only one physical section (CSv_1) while all other sections in this zone (CSv_2, . . . , v_i, . . . , CSv_I) are supposed to be either invalid or storing the same data as the flag section. Those virtual sections (CSv_2, . . . , CSv_i, . . . , CSv_I) represented by dash lines in FIG. 5(d) do not actual exist physically. They do not need to occupy any hardware because we already assume their lookup results would be identical to the flag section (CSv_1) if their corresponding valid bits are set. Although "V zones" of the present invention have only one physical section, they can have different sizes representing the number of supported virtual sections. The virtual sections in a V zone also can be replaced by virtual zones based on similar concepts.

The area and power consumption of a V zone is equal to that of one section. V zone is therefore highly efficient in power/area saving for CAM devices with sorted data. However, when all the V zone along one column of a CAM device are all occupied, it would be impossible to add one more entry with section data completely different from all the partially occupied V zones. This problem is called "V zone overflow" problem. The power consumption of an F zone is about the same as that of a V zone when its S bit is set, while it offers the flexibility to allow sections with different data in its zone boundary. Combination of V zone and F zone will provide power/area saving while avoiding the V zone overflow problem.

While specific embodiments of the invention have been illustrated and described herein, it is realized that other modifications and changes will occur to those skilled in the art. Upon disclosure of the above zones, many other types of zones can be easily developed for different applications. For example, we can pre-define the data in a V zone so that we can use a simple AND logic circuit to support its operation as shown in FIG. 5(e). In this example, one of each complementary data pair (D1, D1#, D2, D2#, . . . D7, D7#) is chosen to be connected to an AND gate, which is also connected to the lookup result of previous zone (HTdp). The AND logic circuit executes logic AND operation of all its inputs, and set its output signal (HTd) only when all inputs are '1'. This zone illustrated by FIG. 5(e) comprised no CAM cells. Its structure is similar to a decoder so that it is called a "D zone" of the present invention. D zone is special kind of V zone that only can store sections with a pre-defined data. Its hardware is very simple, but it has little flexibility. It is very easy to generate different types of zones by combining different zone structures. FIG. 5(f) illustrates another type of zone that is half "D zone" half "V zone". It is called partially decoded zone (P zone) of the present invention. P zone is also a special kind of V zone. FIG. 5(g) shows another CAM zone of the present invention called programmable virtual zone (PV zone). In this example, the PV zone comprises 4 physical sections (CSpv_1, CSpv_2, CSpv_3, CSpv_4) equipped with CAM cells and SC logic circuits (SCLpv_1, SCLpv_2, SCLpv_3, SCLpv_4). These physical sections (CSpv_1, CSpv_2, CSpv_3, CSpv4) are able to store different data while executing lookup operations just like common CAM sections. All other sections in this zone (CSpv_5, CSpv_6, . . . , CSpv_i, . . . , CSpv_I) are virtual sections that are supposed to be either invalid or storing the same data as one of the physical sections (CSpv_1, CSpv_2, CSpv_3, CSpv4). These virtual sections (CSpv_5, CSpv_6, . . . , CSpv_i, . . . , CSpv_I) represented by dash lines in FIG. 5(g) do not need to have physical circuits to store full set of data. Each virtual section comprises an identification memory device (ID_5, ID_6, . . . , ID_i, . . . , ID_I) linking its data with one of the physical sections. For the example in FIG. 5(g), the identification memory device stores at least two binary bits to indicate the data in the corresponding virtual section is identical to which one of the 4 physical sections. After a lookup operation, the lookup results (H1, H2, H3, H4) of the physical sections are sent to the identification memory devices device (ID_5, ID_6, . . . , ID_i, . . . , ID_I). The lookup results of the virtual sections (H_5, H_6, . . . , H_i, . . . H_I) are therefore set to be the same of their corresponding physical sections. This PV zone of the present invention is a special type of V zone that provides additional flexibility.

The above special zones such as F zone or V zone achieve power saving when all sections in a zone contain identical data. In many cases, sections in the same zone contain similar but not completely identical data so that those special zones are not useful. For such situations, we can achieve power saving using "common data register" (CDR) of the present invention. A zone equipped with CDR is called "C zone" of the present invention. A C zone can comprise multiple zones of various types, including zones in different columns. A CDR comprises multiple number of bits storing a data pattern that indicates the shared data pattern for all the valid sections in the C zone. A bit in CDR can have four possible states representing the status of one data bit in all sections of the C zone. CDR State '1' means the corresponding bits in all the valid sections store either binary value '1' or ternary value "don't care". CDR State '0' means the corresponding bits in all the valid sections store either binary value '0' or ternary value "don't care". CDR State 'X' means the corresponding bits in all the valid sections store the same ternary value "don't care". CDR State 'D' means the corresponding bits stored in one or more valid sections store binary value '1' and at least one other valid section stores binary value '0'.

The values of CDR data are determined according to the float chart in FIG. 5(i). At initial condition, the valid bit of CDR is reset, while all the CDR data bits are set to state 'X'. When there is a CAM write operation into one of the entry in the C zone, the values of CDR bits are updated according to the logic operation described in Table 2.

TABLE 2

CDR update truth table

| CDR state\CAM update data | 0 | 1 | "don't care" |
|---|---|---|---|
| 0 | 0 | D | 0 |
| 1 | D | 1 | 1 |
| X | 0 | 1 | X |
| D | D | D | D |

During a CAM lookup operation, incoming lookup data are compared with CDR data according to the truth table listed in Table 3. If a lookup data bit is '1' while the CDR data bit is '0', or if a lookup data bit is '0' while the CDR data bit is '1', the bit comparison result is "miss", while all other conditions are 'hit'. When one or more bits in CDR lookup result in "miss", the CAM lookup results for all the entries in the C zone will be "miss". Power saving can be achieved by stopping the CAM lookup operation of the C zone. If the CDR lookup result is "hit", we can save power by executing CAM lookup only to bits with CDR value 'D'. There is no need to waste power looking up bits with CDR state '0', '1', or 'X' because we know the bit-wise comparison results will always be "match" for all those bits.

TABLE 3

CDR lookup truth table

| CDR state\Lookup data | 0 | 1 | "don't care" |
|---|---|---|---|
| 0 | hit | miss | hit |
| 1 | miss | hit | hit |
| X | hit | hit | hit |
| D | hit | hit | hit |

When an entry is removed, all the bits in CDR containing states '0', '1', or 'X' should remain the same. The value of bits originally at 'D' state can be determined by CAM lookup to those bits. To save trouble, we also can keep them at 'D' state.

C zone can be implement in other variations. The key feature of a C zone is that it executes a lookup to shared pattern in the C zone before CAM lookup. Whenever the data stored in C zones comprise the same partial data pattern, significant power saving can be achieved for both CDR miss and CDR hit situations. A CDR can have one bit for every data bit of a CAM entry, or contains selected partial data bits; it can cover one zone or multiple zones, or zones in different columns. A CDR does not need to be placed inside of a C zone physically. Placing CDR's at central location often can achieve optimum power saving for many practical applications. For large CAM devices, we can define CDR for CDR's to form multiple levels of C zones for optimum power saving.

FIG. 6 is a symbolic diagram illustrating a CAM array implementing the power saving features disclosed in previous sections. Each CAM entry is divided into sections of variable sizes that are assigned to zones of different sizes and types. V zones are marked with 'V', F zones are marked with 'F', and common zones are marked with 'Z' in FIG. 6. In this symbolic diagram the sizes of those zones represent the number of sections in the zones. For example, a V zone that occupies large area means it comprises many virtual sections; its area is not related to actual physical area; in reality a V zone occupies very small physical area because it has only one physical section. A column in FIG. 6 represent zones occupy the same portion of entry sections; the actual physical location of different columns in the figure may be different; the first few columns usually overlap in physical area for a CAM device of the present invention.

The CAM data are sorted before stored into this CAM array. We are assuming data with high degree of similarity are stored toward the lower left corner in FIG. 6, while the degree of similarity decreases toward upper right corner. The sizes of zones are larger near the lower left corner of the CAM array where CAM data stored in nearby sections have high similarity. The sizes (number of sections within the zone) of zones are smaller moving toward upper left corner of the CAM array, where data stored in nearby sections have less similarity due to the sorting procedures. Similarly, we should use more V zones for areas likely to have identical data, F zones for areas need flexibility, and common zones for areas unlikely to have identical section data. FIG. 6 illustrates one typical zone distribution in a CAM array of the present invention.

A lookup operation starts from zones in the first (left) column. Zones detected "match" in the first column will activate lookup for zones in the second column that occupy sections from the same entries, while other zones would remain idle. This process propagates column by column until the whole array is checked. Shaded zones in FIG. 6 represents zones that are activated during a typical lookup operation. The first column is completely activated but it consumes little power because most of zones in the first column are V zones or F zones with S flag set. Based on the lookup results in the first column, only a few zones are activated in the second column. Fewer and fewer zones consume power in the following columns. Sometimes the first column is divided into several sub-columns to be checked in series for further power saving.

It is obvious that the design of the first few columns, as well as how the data are stored into them, are critical in power/area saving for CAM devices of the present invention. When the data are evenly distributed, we can use minimum number of V zones. When the data are fully diversified, minimum number of zones would be activated in the next column. For the example when we have 1 M (1024×1024) 8-bit entries in the first column, ideally we would like to have 256 different data set while each data set occupies 4K identical sections. Practical data distribution certainly won't be so well-behaved in its natural format. Therefore a method called "out of sequence data storage" (OSDS) is developed to optimize CAM data storage. The OSDS method takes advantage of the fact that we can re-arrange the order of the data in a CAM entry without changing the lookup result (miss or match). One example of the OSDS sorting procedures are listed as follows:

Step 1: Gather all data sets to be stored into CAM entries.

Step 2: Execute a statistical analysis to find data bits that have nearly even distribution. For BCAM, we should look for data bits that have ~50% chances to be '1' or '0'. For TCAM, we should look for data bits that have ~33% chances to be '1', '0', or "don't care".

Step 3: Execute another statistical analysis among those bits identified in step 2 to find bits that are independent to other bits. For example, if the first bit is '1', the other BCAM bit should have ~50% chances to be '1' or '0'.

Step 4: Select a set of bits identified in Steps 2–3 to be placed in the first few columns, then execute sorting to place similar data sets into the same CAM zones.

In the above example, random and evenly distributed bits are selected and placed in the first few columns to achieve optimum power/area saving results. A specific data analysis method is described in the above example. There are many other data analysis methods available to choose proper data arrangements for the CAM arrays of the present invention. That is why CAM devices of the present invention often have hardware option to re-arrange the lookup data before lookup.

Software data control methods are flexible and easy to change but they require much longer time comparing to hardware data control. The present invention provides hardware data update mechanism to optimize CAM data storage with extremely high efficiency. FIG. 5(*d*) illustrates a zone equipped with zoned write control logic (ZWL) for hardware data control. An entry available signal (AVL) is sent to ZWL indicating there is at least one entry available for new data storage. This AVL signal is provided by lookup results on the valid bits. The zoned write control logic (ZWL) also detects the lookup results provided by SC logic circuit (SCLv_1) to generate zoned hit signal (ZHTv#). The zoned write control logic (ZWL) also accepts a column write (CW) input signal to control CAM write operation. When CW is set while the zoned lookup indicating match, ZWL would send out a zoned write signal (ZW) indicating we want to write data into one of the available entries within this zone. The example in FIG. 5(*d*) is a V zone, but any kind of zone can comprise similar write control logic to provide zoned hit signals. The zoned hit signals (ZH1, ZH2, . . . ) and column write signals (CW1, CW2, . . . ) are usual shared by zones in the same column as illustrated in FIG. 6. A CAM data write operation can be executed following the following steps:

Step W1: Start a CAM lookup operation using the data inputs for intended CAM write operation. The zoned write control logic circuits in the CAM device will detect zoned matches and pulled down zoned hit signals (ZH1, ZH2, . . . ). The resulting zoned hit signals indicate the most similar available zone in the CAM device. For example, if the most similar available zone in the CAM device has three high order zones with identical section data as the input data, then ZH1, ZH2, and ZH3 will be flagged while ZH4 . . . remain unchanged.

Step W2: Activate the column write signal (CW1, CW2, . . . ) at the lowest order column with flagged zoned hit signal. In the previous example, we should activate CW3. The zoned write control logic in the zone with the most similar data would turn on its zoned write signal (ZW).

Step W3: select the most proper available CAM entry within the zone with ZW bit set. Since current art CAM entry selection methods are available for such entry selection procedures, no details would be discussed here.

Step W4: write the input data into selected entry.

The above hardware supported CAM write operation will automatically sort the CAM storage data for optimum area/power saving for CAM devices of the present invention.

While specific embodiments of the sorting operation have been illustrated and described herein, it is realized that other modifications and changes will occur to those skilled in the art. For example, we can select the first few columns, instead of all columns, to participate in the sorting operation. Using fewer columns will simplify the sorting operation while achieving nearly the same efficiency. It is also possible to skip some columns. For example, if the first two columns are all V zones, we only need one set of sorting circuit for both columns. This sorting procedure also can be executed without interfering normal update operations if the sorting lookup uses a second port for sorting related CAM columns. One problem for the above sorting procedure is that it does not consider removal of existing entries. When existing entries can be removed from filled zones, the above sorting lookup can result in multiple "best fit zone", making selection more complex. This problem can be solved by a "priority counter" book keeping mechanism of the present invention as described by the floating chart in FIG. 5(*h*). To support this mechanism, a zone involved with sorting is equipped with an up/down counter called priority counter. During an entry removal operation, a lookup operation is executed to determine if the CAM device already has an entry with identical data, and to execute sorting lookup to obtain zone hits. If we can not find any identical entry, there is no need to execute the removal operation. If an entry is found to store identical data, we should check if the zone contains the hit entry is full. If it is full, we should send a signal to all sorting zones with zone hits, and add one to their priority counters before the entry is removed. If the zone is not full, we can remove the entry, then check if the zone is empty after the removal. If the zone becomes empty, then a signal is send to all sorting zones with zone hits to minus one from their corresponding priority counter. In this way, the priority counters of partially filled zones with the same data will record a number that is different from any other such zones. During an entry write operation, a sorting lookup described in previous section is executed. Because some of the filled zone may have available entries due to removal procedures, we may find multiple "best fit" zones. Among those best fit zones, the latest one that was make available will have zero data in its priority counter. That unique zone is chosen to take the new entry. If the chosen zone is full after taking the new entry, we should substrate 1 to all the priority counters found by the sorting lookup operations. Using the above mechanism, the CAM device will have a data structure that is highly efficient in power saving using zoned architectures of the present invention.

The above discussions did not discuss the power needed to send global signals, such as data, clock, and control signals, into the CAM array. The zoned CAM structures of the present invention also provide significant power saving on global signals because global signals only need to see one input loading in each zone, instead of one loading on each entry. Further power savings can be achieved by sending global signals using small signal data transfer mechanisms.

With proper design, the power consumption of CAM array of the present invention could be less than $1/1000$ of prior art CAM array with equal amount of data.

According to above descriptions and the disclosures made in the drawings, this invention discloses a content addressable memory (CAM) device. The CAM device includes a plurality of CAM entries each further includes a plurality of CAM cells for storing a set of stored data for comparison with a set of input data. The CAM device further includes a partial lookup means for carrying out a partial lookup by comparing a subset of the input data with a corresponding subset of stored data. In a preferred embodiment, the partial lookup means further includes a subsequent lookup enabling means for generating a subsequent lookup-enabling signal based on a result of the partial lookup. In a preferred embodiment, each of the CAM cells includes a memory circuit having a memory node for storing a first digital data; And, each of the CAM cell further includes a data controlled pass-gate means connected to the memory node for receiving and writing a second digital data to the memory node and for comparing the second digital data with the first digital data.

The present invention provides novel CAM cells with DCPG structures to achieve significant area reduction. Power saving are achieved by sectioned and zoned lookup procedures. While specific embodiments of the invention have been illustrated and described herein, it is realized that other modifications and changes will occur to those skilled in the art. It is therefore to be understood that the appended claims are intended to cover all modifications and changes as fall within the true spirit and scope of the invention.

Although the present invention has been described in terms of the presently preferred embodiment, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

I claim:

1. A content addressable memory (CAM) cell comprising:
   four transistors configured as a back-to-back inverter for forming a bi-stable memory having a first and a second memory nodes for storing a pair of stored complimentary binary bits;
   a fifth transistor connected to said first memory node and a conductive line connected to said second memory nodes for receiving a pair of input complimentary binary bits therefrom; and
   an exclusive OR logic circuit comprising four transistors connected to said back-to-back inverter for comparing said input complimentary binary bits with said pair of stored complimentary binary bits for generating a match-mismatch signal; and
   a gate of said fifth transistor further connected to a wordline driver for controlling different read and write relative wordline voltages for carrying out a single-bit-line-write (SBLW) operation for writing said pair of complimentary binary bits to said first and second memory nodes.

2. The CAM cell of claim 1 further comprising:
   a lookup overwrite protection circuit for preventing an inverting of said pair of stored complimentary binary bits stored in said first and second memory nodes.

3. The CAM cell of claim 1 further comprising:
   a seventh transistor connected to said fifth and sixth transistors for on/off activating said CAM cell.

4. The CAM cell of claim 3 wherein:
   said seventh transistor controlling a timing of said on/off activation of said CAM cell for preventing an inverting of said pair of stored complimentary binary bits stored in said first and second memory nodes.

5. The CAM cell of claim 1 further comprising:
   a second set of four transistors configured as a back-to-back inverter for forming a bi-stable memory having a third and a fourth memory nodes for storing a second pair of stored complimentary binary bits;
   a eleventh and a twelfth transistors connected to said third and said fourth memory nodes respectively for receiving a second pair of input complimentary binary bits therefrom wherein said eleventh and twelfth transistors are connected to said fifth and sixth transistors; and
   said fifth and sixth transistors and said eleventh and twelfth transistors providing a control of bit-inversions of said pairs of stored complimentary binary bits stored in said first and second memory nodes and said third and fourth memory nodes respectfully to generate a match-mismatch-don't-care ternary signal between two input binary bits each selected from said first and second pairs of input complimentary binary bits and corresponding two binary bits of said first and second pairs of stored complimentary binary bits.

6. The CAM cell of claim 5 wherein:
   a gate of one of said fifth and sixth transistors and a gate of one of said eleventh and twelfth transistors are connected to a reset port for inputting a don't-care reset input signal.

* * * * *